United States Patent
Kume et al.

(10) Patent No.: US 9,231,105 B2
(45) Date of Patent: Jan. 5, 2016

(54) SEMICONDUCTOR DEVICE WITH GROUP-III NITRIDE COMPOUND SEMICONDUCTOR LAYER ON SUBSTRATE FOR TRANSISTOR

(71) Applicant: Renesas Electronics Corporation, Kawasaki-shi, Kanagawa (JP)

(72) Inventors: Ippei Kume, Kanagawa (JP); Hiroshi Takeda, Kanagawa (JP); Toshiharu Nagumo, Kanagawa (JP); Takashi Hase, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/464,912

(22) Filed: Aug. 21, 2014

(65) Prior Publication Data

US 2015/0060875 A1 Mar. 5, 2015

(30) Foreign Application Priority Data

Aug. 27, 2013 (JP) ................... 2013-175991

(51) Int. Cl.
*H01L 29/78* (2006.01)
*H01L 29/20* (2006.01)
*H01L 29/40* (2006.01)

(52) U.S. Cl.
CPC ........ *H01L 29/7835* (2013.01); *H01L 29/2003* (2013.01); *H01L 29/402* (2013.01)

(58) Field of Classification Search
CPC .................................................. H01L 29/7835
See application file for complete search history.

(56) References Cited

U.S. PATENT DOCUMENTS

| 8,072,002 B2 | 12/2011 | Niyama et al. |
| 2011/0215424 A1 | 9/2011 | Sato |

FOREIGN PATENT DOCUMENTS

| JP | 2009-246292 A | 10/2009 |
| JP | 2011-187623 A | 9/2011 |

*Primary Examiner* — Thanh V Pham
(74) *Attorney, Agent, or Firm* — Miles & Stockbridge P.C.

(57) ABSTRACT

To realize a transistor of normally-off type having a high mobility and a high breakdown voltage. A compound semiconductor layer is formed over a substrate, has both a concentration of p-type impurities and a concentration of n-type impurities less than $1 \times 10^{16}/cm^3$, and includes a group III nitride compound. A well is a p-type impurity layer and formed in the compound semiconductor layer. A source region is formed within the well and is an n-type impurity layer. A low-concentration n-type region is formed in the compound semiconductor layer and is linked to the well. A drain region is formed in the compound semiconductor layer and is located on a side opposite to the well via the low-concentration n-type region. The drain region is an n-type impurity layer.

9 Claims, 29 Drawing Sheets

CGS

CGD

CDS

FIG. 27
Si-MOS fsw=300kHz
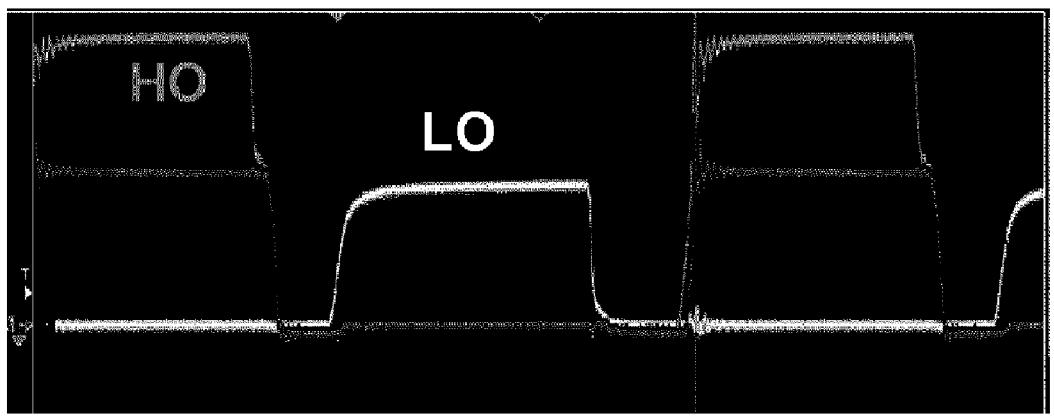
GaN fsw=300kHz
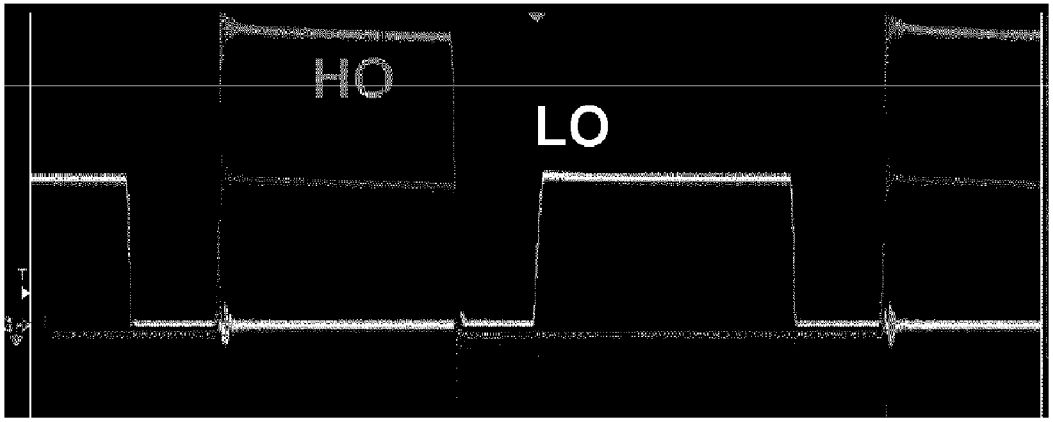

Si-MOS fsw=1MHz

GaN fsw=10MHz

SEMICONDUCTOR DEVICE WITH GROUP-III NITRIDE COMPOUND SEMICONDUCTOR LAYER ON SUBSTRATE FOR TRANSISTOR

CROSS-REFERENCE TO RELATED APPLICATION

The disclosure of Japanese Patent Application No. 2013-175991 filed on Aug. 27, 2013 including the specification, drawings and abstract is incorporated herein by reference in its entirety.

BACKGROUND

The present invention relates to a semiconductor device, and for example, to a technology applicable to a semiconductor device having a transistor using a compound semiconductor layer.

In the field of power semiconductor, the demand for an increase in breakdown voltage and a reduction in resistance is rising. The degree of difficulty in device design of an element using a silicon substrate is increasing because of the adoption or the like of a complicated structure called super junction in order to achieve performance exceeding the physical limit.

In contrast to this, in recent years, development of the field effect transistor using a group III nitride semiconductor has been in progress. Such a transistor includes the HEMT (High Electron Mobility Transistor) using the AlGaN/GaN-based material and the MOSFET (Metal-Oxide-Semiconductor Field Effect Transistor) using the Ga-based material. For example, in the transistor having the AlGaN/GaN heterojunction structure, two-dimensional electron gas is generated at the interface due to polarization by the piezo effect. The two-dimensional electron gas has high electron mobility and a high-carrier density and is capable of giving a low-on resistance and high-speed switching characteristics to the transistor.

In the case where a transistor is used as an element for power control, the transistor is required to have a low resistance and a high breakdown voltage between drain and gate. Furthermore, the transistor using the two-dimensional electron gas is commonly a transistor of normally-on type. In order to reduce power consumption of the transistor, it is preferable to form the transistor into a normally-off type.

In contrast to this, Japanese Patent Laid-Open No. 2009-246292 (Patent Literature 1) describes that it is possible to give both a high mobility and a high breakdown voltage to the GaN-FET by using the electron transit layer using the two-dimensional electron gas as an electric field relaxation layer. Furthermore, Patent Literature 1 describes that the transistor is formed into the normally-off type by separating the electron transit layer by the recess formed so as to reach the electron transit layer. However, in the structure of Patent Literature 1, the threshold voltage and the channel resistance vary considerably depending on the depth of the recess. Furthermore, due to the damage caused by the recess processing, the mobility in the channel part reduces and the channel resistance increases. Because of this, it is difficult to simultaneously achieve a normally-off type, a high mobility, and a high breakdown voltage in the GaN-FET as a whole.

Japanese Patent Laid-Open No. 2011-187623 (Patent Literature 2) describes formation of the electric field relaxation layer by introducing n-type impurities into the p-type GaN substrate without using the two-dimensional electron gas. In detail, Patent Literature 2 describes that the electric field relaxation layer having high mobility and a high breakdown voltage is obtained by setting the sheet carrier concentration of the electric field relaxation layer to $1 \times 10^{15}$ cm$^{-3}$ or more and $5 \times 10^{17}$ cm$^{-3}$ or less.

SUMMARY

As described above, the transistor used for power control is required to be of normally-off type and to have a high mobility and a high breakdown voltage. The inventors of the present invention have examined the transistor having these three characteristics. The other tasks and the new feature will become clear from the description of the present specification and the accompanying drawings.

According to the present invention, the semiconductor device includes a substrate, a compound semiconductor layer, a source region, a low-concentration n-type region, a drain, a gate insulating film, and a gate electrode. The compound semiconductor layer is formed over the substrate, of which both the concentration of p-type impurities and the concentration of n-type impurities are less than $1 \times 10^{16}$/cm$^3$, and which includes a group III nitride compound. The source region is formed in the compound semiconductor layer and is an n-type impurity layer. The low-concentration n-type region is formed in the compound semiconductor layer and linked to a well. The drain region is formed in the compound semiconductor layer and located on the opposite side of the well via the low-concentration n-type region. Furthermore, the drain region is an n-type impurity layer. The gate insulating film is formed over the portion of the well located between the source region and the low-concentration n-type region. The gate electrode is formed over the gate insulating film.

According to the present invention, it is possible to realize a transistor of normally-off type and having a high mobility and a high breakdown voltage.

BRIEF DESCRIPTION OF THE DRAWINGS

FIG. 27 is a diagram for explaining output waveforms when Si-MOS and LDD-MISFET are caused to operate, respectively, in the circuits in FIG. 26;

DETAILED DESCRIPTION

Hereinafter, embodiments of the present invention will be explained by using drawings. In all the drawings, the same symbols are attached to the same components and explanation is omitted appropriately.

First Embodiment

Figure 1:
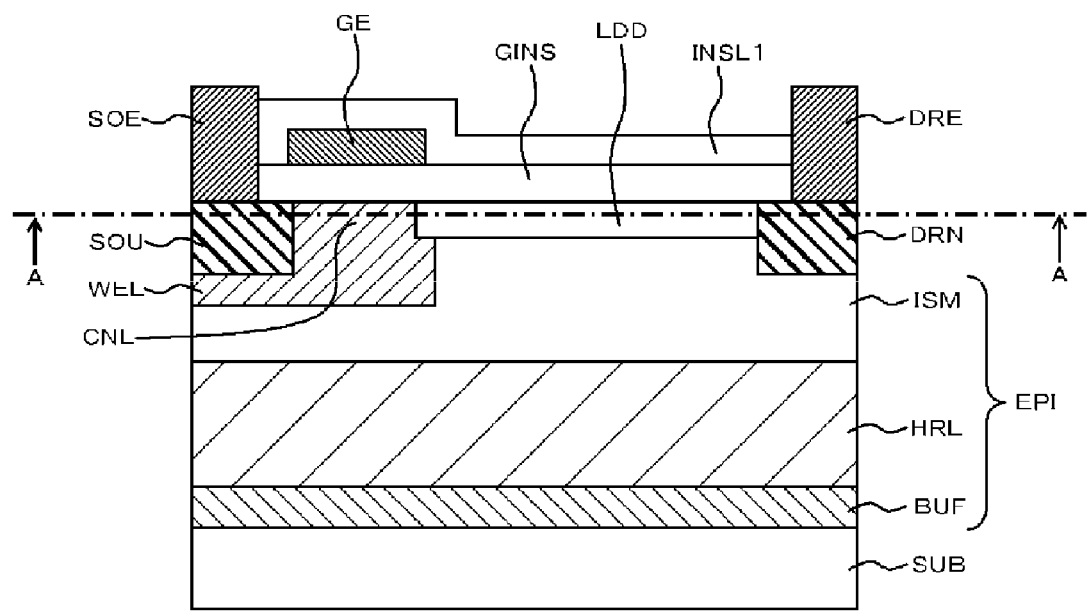
FIG. 1 is a cross-sectional view schematically illustrating a semiconductor device in a First Embodiment.

FIG. 1 is a cross-sectional view schematically illustrating a semiconductor device in a First Embodiment. The semiconductor device of the present embodiment includes a substrate SUB, a compound semiconductor layer ISM, a source region SOU, a low-concentration n-type region LDD, a drain region DRN, a gate insulating film GINS, and a gate electrode GE. The compound semiconductor layer ISM is formed over the substrate SUB, of which both the concentration of p-type impurities and the concentration of n-type impurities are less than $1 \times 10^{16}/cm^3$, and which includes a group III nitride compound. The source region SOU is formed within the compound semiconductor layer ISM and is an n-type impurity layer. The low-concentration n-type region LDD is formed in the compound semiconductor layer ISM and linked to a well WEL. The drain region DRN is formed in the compound semiconductor layer ISM and located on the opposite side of the well WEL via the low-concentration n-type region LDD. The drain region DRN is an n-type impurity layer. The gate insulating film GINS is formed over the portion of the well WEL, located between the source region SOU and the low-concentration n-type region LDD. In addition, the gate electrode GE is formed over the gate insulating film GINS.

In the group III nitride compound, the activation rate of the p-type impurity is low, and thus the p-type layer of the group III nitride compound includes many p-type impurities not activated. Because of this, even if the n-type impurity region is formed by implanting n-type impurities into the p-type group III nitride compound layer, the mobility of carriers in this impurity region reduces due to the presence of p-type impurities.

In contrast to this, the compound semiconductor layer ISM is a layer intentionally without impurities doped and both the concentration of p-type impurities and the concentration of n-type impurities are less than $1 \times 10^{16}/cm^3$. Because of this, by forming the low-concentration n-type region LDD in the compound semiconductor layer ISM, it is possible to keep high the mobility of carriers in the low-concentration n-type region LDD. Furthermore, the low-concentration n-type region LDD is formed, and thus it is possible to increase the breakdown voltage between the drain region DRN and the gate electrode GE. Moreover, the portion of the well WEL, located between the source region SOU and the low-concentration n-type region LDD serves as a channel region CNL, and thus it is possible to form the transistor into the normally-off type. Detailed explanation will be given below.

Meanwhile, the constituent components in each embodiment below only selectively illustrate a part of devices constituting each circuit and the scope of right of the present invention is not limited by active devices not related directly to the embodiments according to the present invention, coupling methods of multilayer wirings, and the like.

The semiconductor device illustrated in FIG. 1 has a compound semiconductor layer EPI over the substrate SUB. The compound semiconductor layer EPI has a configuration in which a buffer layer BUF, a high-resistance compound semiconductor layer HRL, and the compound semiconductor layer ISM are stacked over the substrate SUB.

The substrate SUB is, for example, a silicon substrate or a sapphire substrate. The buffer layer BUF is, for example, AlN, AlGaN, a stacked structure thereof, or a stacked structure of AlN/GaN. As these layers, a layer may be used, which is formed by the manufacturing method of a semiconductor substrate or a semiconductor device used commonly and the scope of right of the present invention is not limited by these structures and materials.

The buffer layer BUF is provided in order to absorb lattice mismatch between the substrate SUB and the high-resistance compound semiconductor layer HRL and to suppress an internal stress.

The high-resistance compound semiconductor layer HRL is formed of a material having a sheet resistance higher than that of the compound semiconductor layer ISM, and thus has a breakdown voltage higher than that of the compound semiconductor layer ISM. The high-resistance compound semiconductor layer HRL is formed by, for example, doping impurities for improving insulating properties into the compound semiconductor made of the same material as that of the compound semiconductor layer ISM.

The thickness of the compound semiconductor layer ISM is, for example, 100 nm or more and 2,000 nm or less. Impurities are not added to the compound semiconductor layer ISM intentionally. Because of this, both the concentration of n-type impurities and the concentration of p-type impurities in the compound semiconductor layer ISM are less than $1 \times 10^{16}/cm^3$, for example, less than $1 \times 10^{15}/cm^3$. The compound semiconductor layer ISM is, for example, GaN, AlN, AlGaN, and AlGaInN.

Meanwhile, in the case where the high-resistance compound semiconductor layer HRL and the compound semiconductor layer ISM are nitride gallium (GaN) layers, the p-type impurity is, for example, Mg and the n-type impurity is, for example, Si. In addition, the high-resistance compound semiconductor layer HRL is formed by introducing impurities, such as C, into GaN.

In the compound semiconductor layer ISM, a MOSFET is formed. The MOSFET has the well WEL, the source region SOU, the drain region DRN, the low-concentration n-type region LDD, the gate insulating film GINS, and the gate electrode GE.

The well WEL is a p-type impurity region and formed by implanting impurities such as Mg, into the compound semiconductor layer ISM. The source region SOU is formed in the well WEL. In addition, the region of the well WEL located between the source region SOU and the low-concentration n-type region LDD serves as the channel region CNL.

The source region SOU, the drain region DRN, and the low-concentration n-type region LDD are formed by implanting impurities such as, for example, silicon (Si), into the compound semiconductor layer ISM. The low-concentration n-type region LDD functions as an electric field relaxation layer (LDD: Lightly Doped Drain). The source region SOU and the drain region DRN have an n-type impurity concentration higher than that of the low-concentration n-type region LDD.

The gate insulating film GINS and the gate electrode GE are formed over the channel region CNL.

The gate insulating film GINS is an insulating film formed by an insulating material including, for example, one selected from $SiO_2$, SiN, and $Al_2O_3$ or an insulating film formed by combining a plurality of layers formed by these insulating materials (for example, silicon nitride film/aluminum oxide film), or a stacked film made of the same material. For example, from the viewpoint of chemical stability of GaN that is a compound semiconductor, it is preferable for the gate insulating film GINS to be formed by the insulating material containing $Al_2O_3$ as a main component. In the example illustrated in FIG. 1, although the gate insulating film GINS is formed also in a region other than the channel region CNL, the insulating film located in a region other than the channel region CNL, for example, the insulating film over the low-concentration n-type region LDD may be formed by a material different from that of the gate insulating film GINS.

Although not limited in particular, it is preferable that the film thickness of the gate insulating film GINS is a thickness of having, for example, a breakdown voltage of 10 V or more. The gate insulating film GINS forms an inversion layer in the channel region CNL, and therefore, a voltage is applied thereto. Preferably, an example of the film thickness of the gate insulating film GINS is, for example, 30 nm or more and 200 nm or less. By setting the film thickness of the gate insulating film GINS to the lower limit value or more, it is possible to apply a voltage of 10 V or more to the gate electrode GE.

It is possible to select the gate electrode GE from a metal material including one selected from, for example, TiN, W, Pt, Hf and the like, or an alloy containing those as main components (for example, 95 mass % or more are contained), or a metal material including those. In addition, a voltage of 10 V or more is applied to the gate electrode GE.

A source electrode SOE is formed over the source region SOU and a drain electrode DRE is formed over the drain region DRN. It is possible to select the material of the source electrode SOE and the drain electrode DRE from the metal material selected from Al, Cu, W, and the like, or the alloy containing these as main components (for example, 95 mass % or more are contained). Meanwhile, it is desirable that the material of the source electrode SOE and the drain electrode DRE is a material that can be ohmic-coupled to the source region SOU and the drain region DRN and that has a low work function. Note that a barrier metal may be present around the source electrode SOE and the drain electrode DRE. It is preferable that the material of the barrier metal is a material that has barrier properties against diffusion of metal, such as Ti, TiN, Ta, and TaN, that has high adhesion to GaN, an insulating film, or the like, that can be ohmic-coupled to an n-type GaN, and that has a low work function.

Meanwhile, the transistor formed over the compound semiconductor layer EPI is electrically floating in its original state, and thus it needs to be grounded. In the semiconductor device of the present embodiment, the electrode for grounding the well WEL is also formed in the same manner as that of the source electrode SOE and the drain electrode DRE. It is preferable that the material of the electrode for grounding the well WEL is a material having a high work function, such as TiN, W, WN, Pt, and Ni.

In addition, over the gate electrode GE and over the gate insulating film GINS, a wiring layer insulating film INSL1 is formed. The wiring layer insulating film INSL1 is, for example, a $SiO_2$ film or a SiN film. It may also be possible to further form a wiring layer constituted by a wiring and an interlayer insulating layer at the upper part of the gate electrode GE, the source electrode SOE, and the drain electrode DRE. Due to this, it is possible to form a semiconductor device having a multilayer wiring structure of the semiconductor device commonly used. It is obvious to a person skilled in the art that such a configuration of the semiconductor device is possible, and thus, in the present embodiment, there is not illustrated, in particular, the structure diagram of the wiring located in the layer further higher than the wiring layer in which the gate electrode GE, the source electrode SOE, and the drain electrode DRE which operate the transistor are formed.

In addition, in the actual semiconductor device, the source region SOU, the gate electrode GE, and the drain region DRN are provided repeatedly. Although the wiring layer has a multilayer structure, in FIG. 1, a single-layer wiring is illustrated for the sake of simplification of the drawing.

Figure 2:
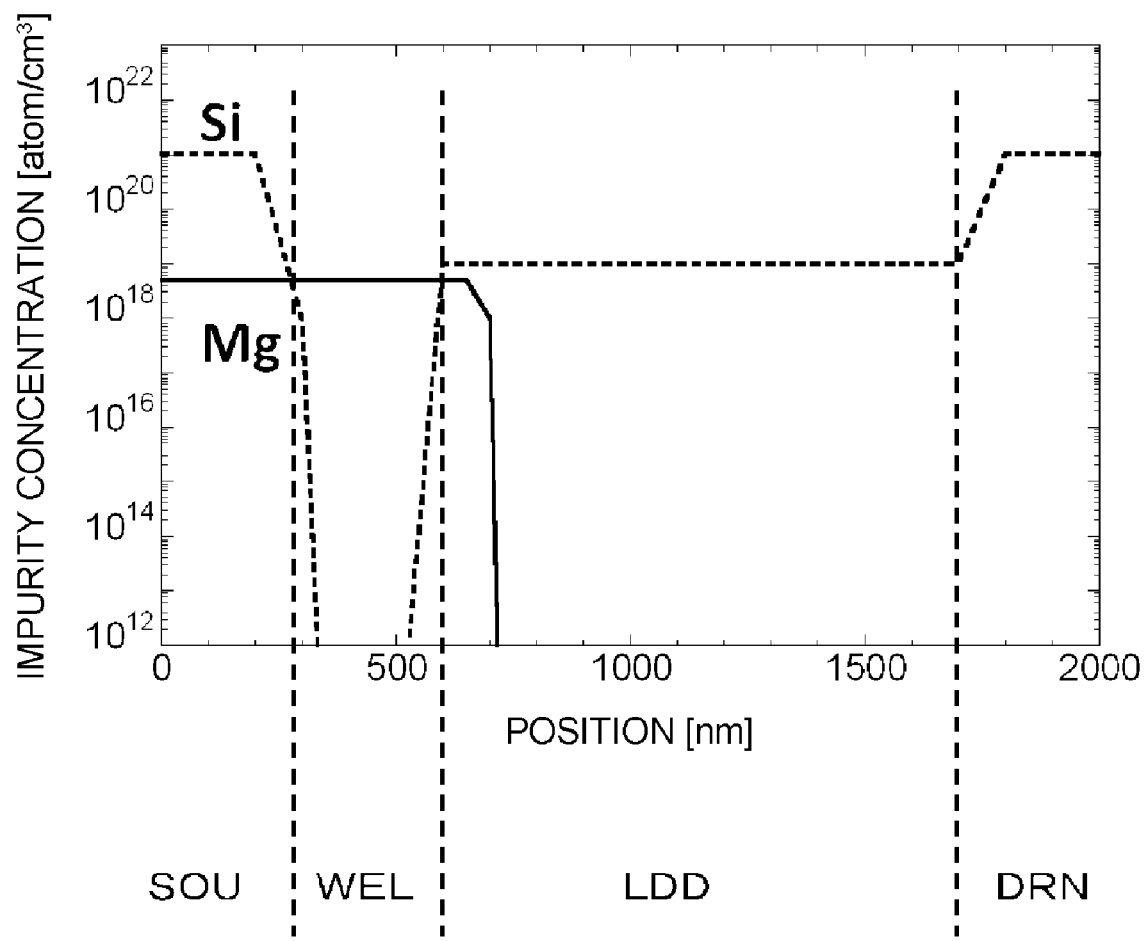
FIG. 2 is a graph illustrating a distribution of impurities in an A-A section in FIG. 1.

FIG. 2 is a graph illustrating a distribution of impurities in an A-A section in FIG. 1. As described above, the source region SOU, the channel region CNL, the low-concentration n-type region LDD, and the drain region DRN are formed by using the compound semiconductor layer ISM. N-type impurities or p-type impurities are not introduced intentionally into the compound semiconductor layer ISM. Therefore, in the drain region DRN and in the low-concentration n-type region LDD, Mg serving as the p-type impurities is not included. Meanwhile, the source region SOU is formed in the channel region CNL, and thus includes Mg.

FIG. 3 to FIG. 8 are diagrams illustrating a manufacturing method of the semiconductor device of the First Embodiment. The manufacturing method of the semiconductor device of the present embodiment includes the following processes. First, the compound semiconductor layer EPI is formed over the substrate SUB. Here, it may also be possible to prepare a substrate in which the compound semiconductor layer EPI is formed over the semiconductor substrate SUB. Next, impurities are implanted into the compound semiconductor layer ISM in order to form the low-concentration n-type region LDD, the source region SOU, the drain region DRN, and the well WEL. Subsequently, a cap film is formed over the compound semiconductor layer EPI and activation annealing for activating impurities is performed. After the activation annealing is performed, the cap film is removed. Next, the gate insulating film GINS is formed over the compound semiconductor layer EPI. After that, the gate electrode GE and the wiring layer insulating film INSL1 are formed. Next, the gate insulating film GINS over the source region SOU and the drain region DRN is removed and the source electrode SOE and the drain electrode DRE are formed. In this manner, a transistor is formed over the semiconductor substrate SUB. Hereinafter, the processes of the present embodiment will be described in detail.

Figure 3:
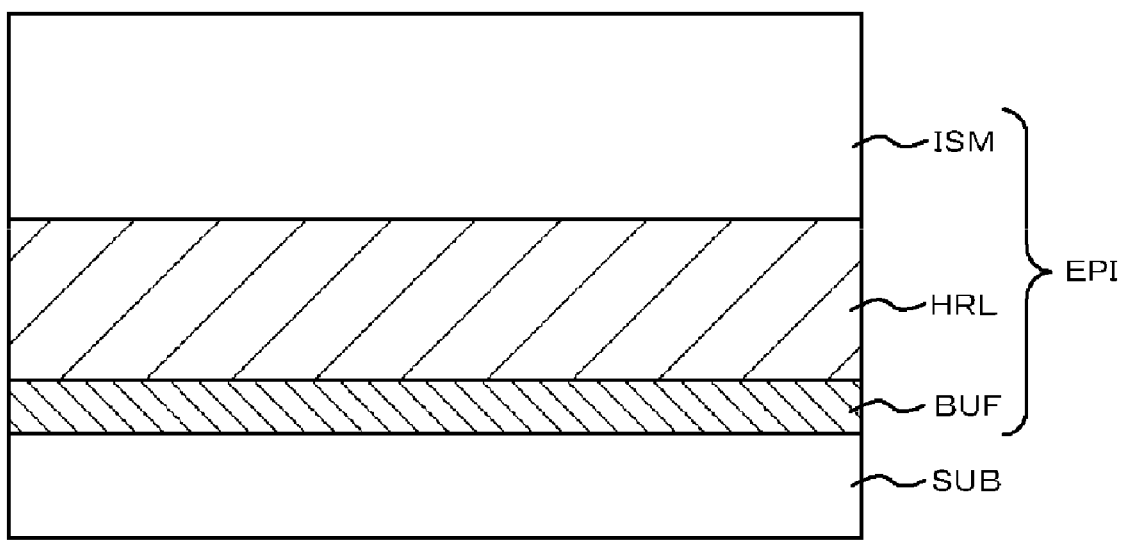
FIG. 3 is a diagram illustrating a manufacturing method of the semiconductor device of the First Embodiment.

First, as illustrated in FIG. 3, the buffer layer BUF, the high-resistance compound semiconductor layer HRL, and the compound semiconductor layer ISM are formed sequentially over the substrate SUB by a method commonly used (e.g., epitaxial growth method). The buffer layer BUF is, for example, AlN and the thickness is, for example, 300 to 1,000 nm. The high-resistance compound semiconductor layer HRL is formed so as to have a thickness of, for example, 100 to 1,000 nm. The high-resistance compound semiconductor layer HRL is formed by the doping of impurities for increasing resistance such as, for example, C (carbon), in the range of $1 \times 10^{16}$ cm$^{-3}$ to $1 \times 10^{19}$ cm$^{-3}$ while forming a film of the compound semiconductor. Then, the compound semiconductor layer ISM is formed so as to have a thickness of 100 to 1,000 nm. During the formation of the compound semiconductor layer ISM, gases serving as raw materials of impurities are not introduced into a film formation chamber.

Figure 4:
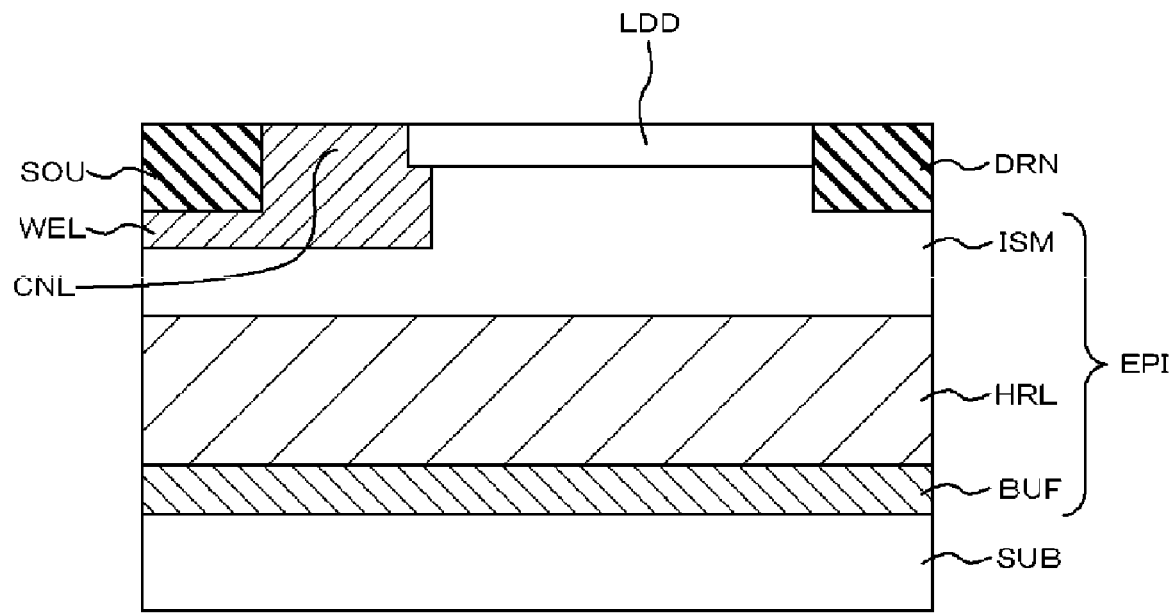
FIG. 4 is a diagram illustrating the manufacturing method of the semiconductor device of the First Embodiment.

Next, as illustrated in FIG. 4, impurities are implanted into the compound semiconductor layer ISM. Due to this, the well WEL, the source region SOU and the drain region DRN, and the low-concentration n-type region LDD are formed. The order of formation of these regions is the order of greater depth of implantation of impurities. Specifically, the well WEL, the source region SOU and the drain region DRN, and the low-concentration n-type region LDD are formed in this order. The depth of implantation of impurities in forming the well WEL is 100 to 500 nm, the depth of implantation of impurities in forming the source region SOU and the drain region DRN is 50 to 300 nm, and the depth of implantation of impurities in forming the low-concentration n-type region LDD is 10 to 50 nm. Furthermore, informing the well WEL, Mg is implanted in the range of $1 \times 10^{16}$ to $1 \times 10^{19}$ cm$^{-3}$, in forming the source region SOU and the drain region DRN, Si is implanted in the range of $1 \times 10^{18}$ to $1 \times 10^{22}$ cm$^{-3}$, and in forming the low-concentration n-type region LDD, Si is implanted in the range of $1 \times 10^{16}$ to $1 \times 10^{19}$ cm$^{-3}$.

Next, although not illustrated, a cap film is formed over the compound semiconductor layer EPI and then impurities are activated by activation annealing.

Figure 5:
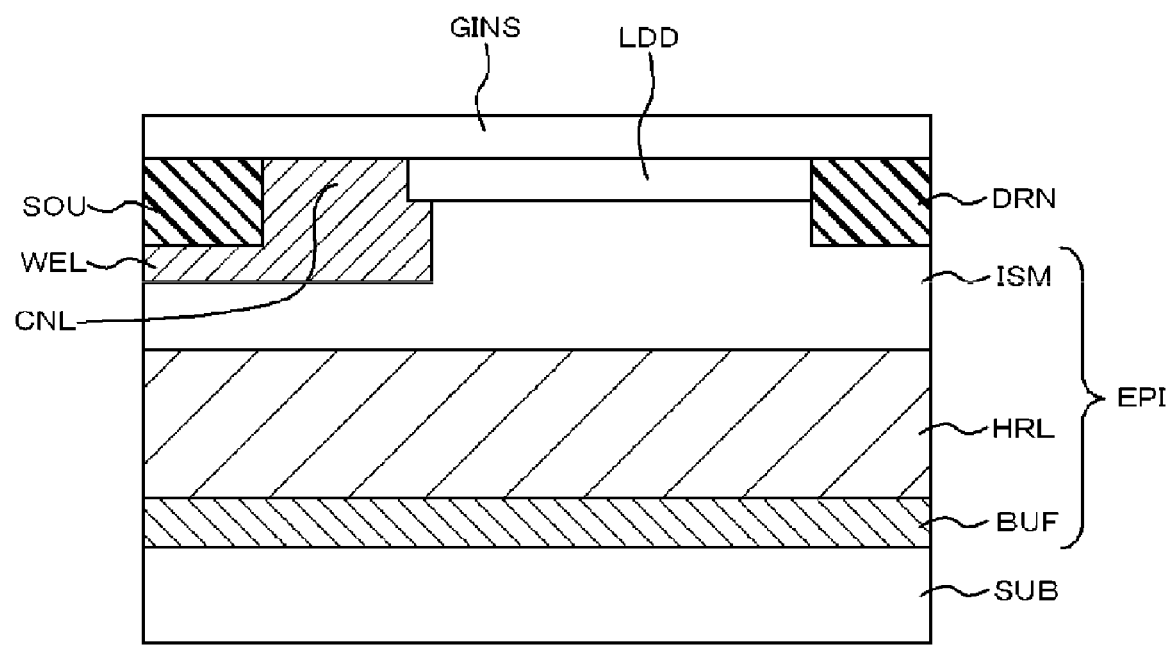
FIG. 5 is a diagram illustrating the manufacturing method of the semiconductor device of the First Embodiment.
Figure 6:
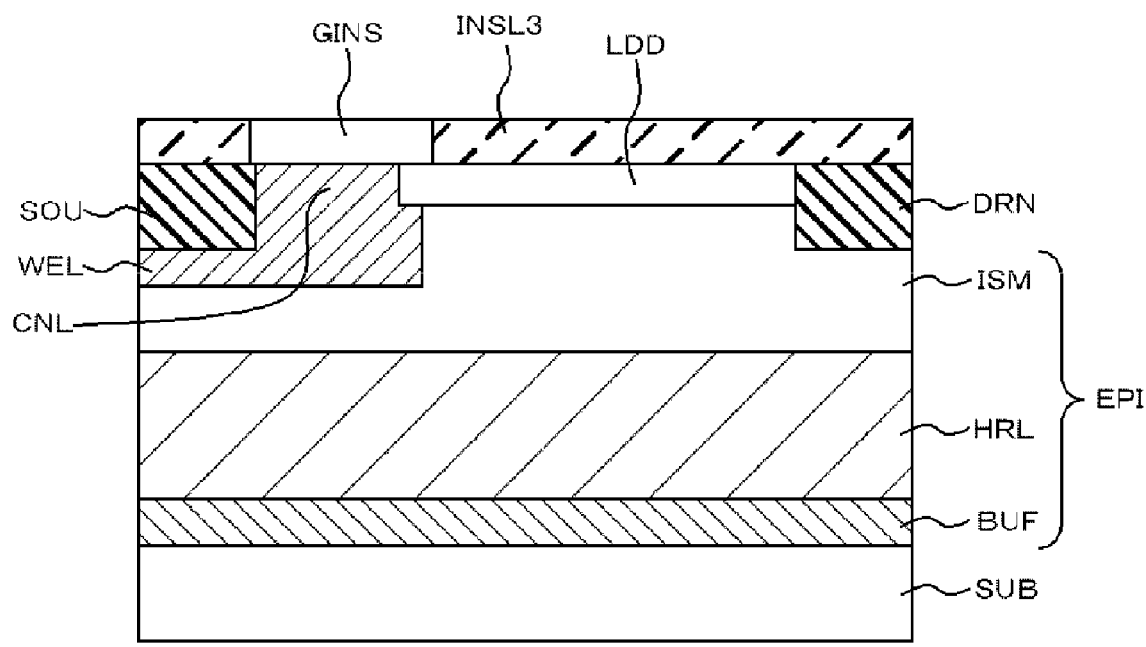
FIG. 6 is a diagram illustrating the manufacturing method of the semiconductor device of the First Embodiment.

Next, as illustrated in FIG. 5, the gate insulating film GINS is formed over the compound semiconductor layer EPI. As the film forming method, it is desirable to use CVD, ALD, and the like. Furthermore, as illustrated in FIG. 6, it is sufficient that the gate insulating film GINS only exists over the channel region CNL, and an insulating film INSL3 made of an insulating material different from that of the gate insulating film GINS may be formed over the source region SOU and the drain region DRN.

Figure 7:
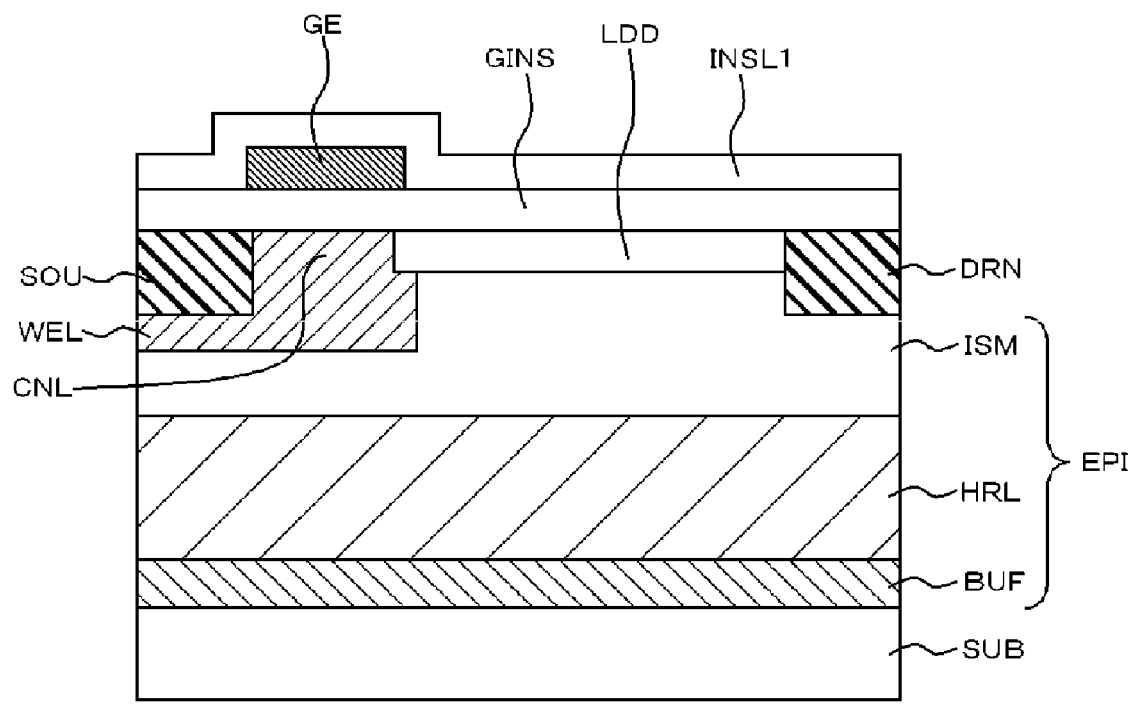
FIG. 7 is a diagram illustrating the manufacturing method of the semiconductor device of the First Embodiment.

Next, as illustrated in FIG. 7, the gate electrode GE is formed over the gate insulating film GINS. Specifically, first, an electrically conductive film serving as the gate electrode GE is formed over the entire surface of the gate insulating film GINS by, for example, the sputter method or the CVD method. Then, the insulating film is processed into a shape of the gate electrode GE by patterning using a photoresist. Meanwhile, although not illustrated, depending on the material of the gate electrode GE, there is a case where the film thickness of the gate insulating film GINS is reduced at the time of processing the gate electrode GE. After the gate electrode GE is formed, the wiring layer insulating film INSL1 is formed. The wiring layer insulating film INSL1 is formed by the CVD method or the ALD method.

Figure 8:
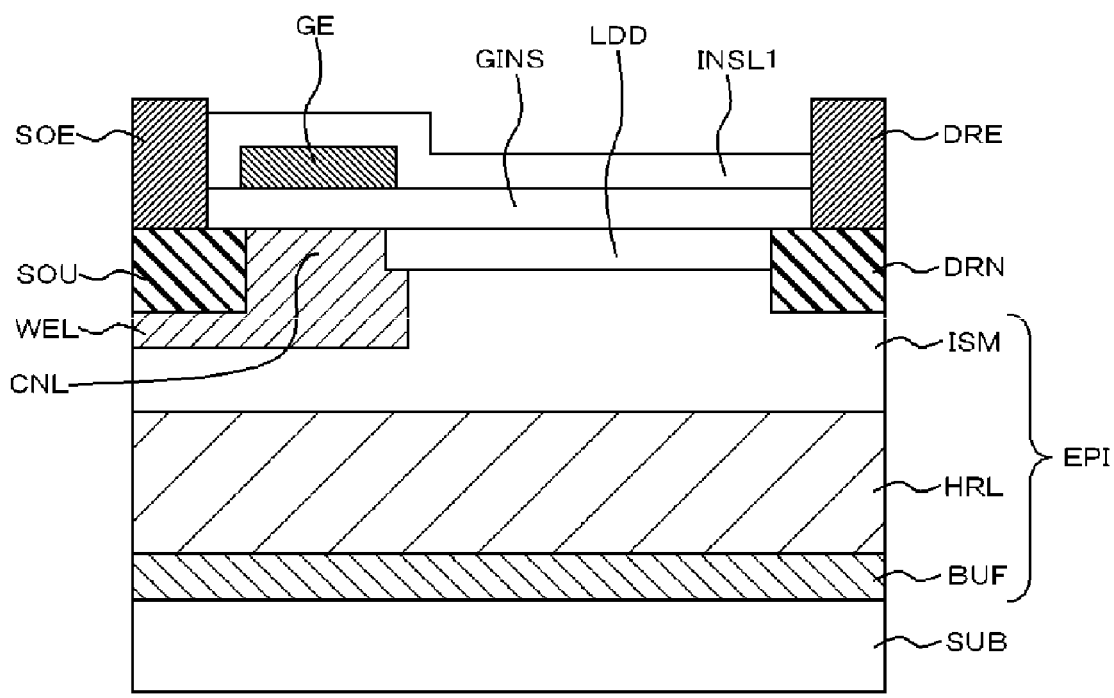
FIG. 8 is a diagram illustrating the manufacturing method of the semiconductor device of the First Embodiment.

Next, as illustrated in FIG. 8, the source electrode SOE and the drain electrode DRE are formed. Specifically, the wiring layer insulating film INSL1 over the source region SOU and the drain region DRN is removed by dry etching or wet etching through the use of a photoresist or a hard mask process. Next, an electrically conductive film (for example, metal film) is formed by a sputter method or the CVD method and the electrically conductive film is patterned into a shape of electrode by the photoresist.

Next, the working effect of the First Embodiment will be explained. According to the present embodiment, the low-concentration n-type region LDD is formed in the compound semiconductor layer ISM. Impurities are not doped into the compound semiconductor layer ISM intentionally at the time of film formation. Because of this, the low-concentration n-type region LDD serves as an electric field relaxation layer excellent in mobility. Furthermore, the well WEL is formed limitedly to the region serving as the source region SOU and the channel region CNL. Therefore, it is possible to form hole carriers in the channel region CNL without reducing the mobility of the low-concentration n-type region LDD and to work the transistor as the normally-off type. Moreover, by implanting high-concentration impurities into the source region SOU and the drain region DRN, it is possible to considerably reduce the coupling resistance of the source electrode SOE and the drain electrode DRE. Due to this, it is possible to reduce all of the channel resistance, the LDD resistance, and the contact resistance, which account for the resistance of the LDD-MISFET device. Consequently, a semiconductor device of the normally-off type, having a low resistance and a high breakdown voltage is realized.

In addition, since the transistor is formed in the compound semiconductor layer ISM, the layer structure of the compound semiconductor layer EPI is simplified and the manufacturing thereof becomes easy. Due to this, the enhancement of the manufacturing yield of the compound semiconductor layer EPI is realized, and as a result, it is possible to reduce the manufacturing cost of the semiconductor device.

Furthermore, between the compound semiconductor layer ISM and the substrate SUB, the high-resistance compound semiconductor layer HRL is formed. Therefore, it is possible to increase the breakdown voltage between the substrate SUB and the drain region DRN. In addition, it is possible to reduce the leak current that flows from the drain region DRN to the substrate SUB.

Second Embodiment

Figure 9:
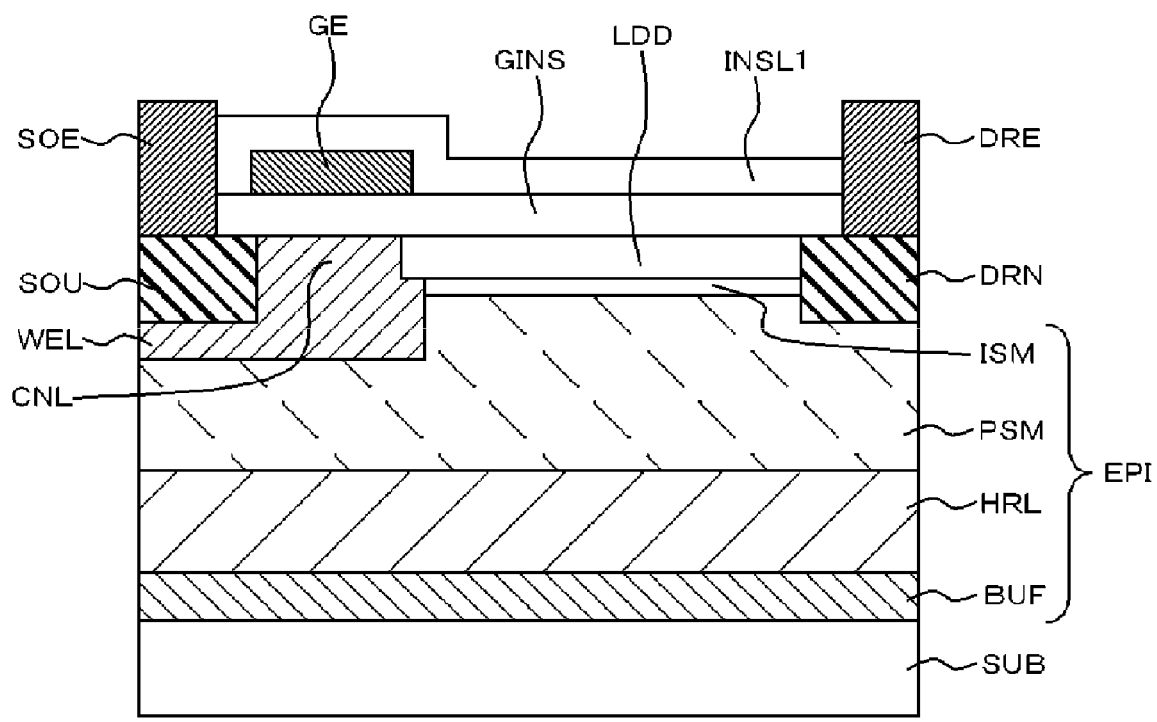
FIG. 9 is a cross-sectional view illustrating a structure of a semiconductor device of a Second Embodiment.

FIG. 9 is a cross-sectional view illustrating a structure of a semiconductor device of a Second Embodiment. The semiconductor device according to the present embodiment has the same configuration as that of the semiconductor device according to the First Embodiment except in that the compound semiconductor layer EPI has a p-type compound semiconductor layer PSM. The p-type compound semiconductor layer PSM is located between the high-resistance compound semiconductor layer HRL and the compound semiconductor layer ISM.

The p-type compound semiconductor layer PSM is formed by introducing p-type impurities (for example, Mg) into the raw material while, for example, forming a film of a compound semiconductor layer. The film thickness of the p-type compound semiconductor layer PSM is, for example, 100 to 1,000 nm and the film thickness of the compound semiconductor layer ISM is in the range of, for example, 10 to 100 nm. In addition, the impurity concentration of the p-type compound semiconductor layer PSM is in the range of, for example, $1 \times 10^{16}$ to $1 \times 10^{19}$ cm$^{-3}$.

Figure 10:
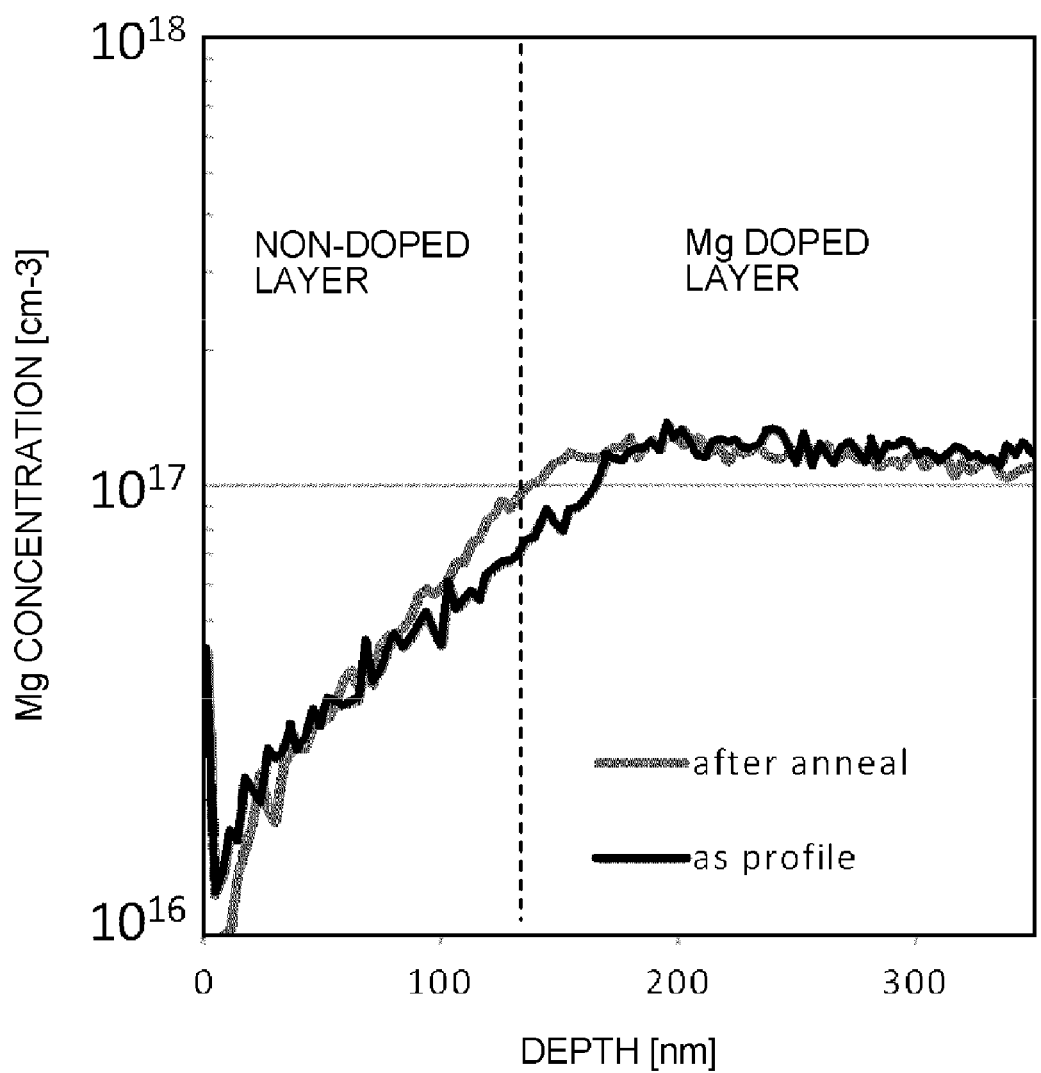
FIG. 10 is a graph illustrating a concentration profile of impurities.

In the present embodiment, the low-concentration n-type region LDD is formed only in the compound semiconductor layer ISM. On the other hand, the lower parts of the source region SOU and the drain region DRN may intrude into the p-type compound semiconductor layer PSM. However, in forming the compound semiconductor layer ISM over the p-type compound semiconductor layer PSM, the impurities (for example, Mg) of the p-type compound semiconductor layer PSM diffuse to the compound semiconductor layer ISM. Therefore, there exists a mixing layer at the interface between the p-type compound semiconductor layer PSM and the compound semiconductor layer ISM. Because of this, in the present embodiment, as illustrated in FIG. 10, the concentration profile of the p-type impurities (for example, Mg) is discontinuous and the portion where the impurity concentration is reduced 50% or more compared with that of the p-type compound semiconductor layer PSM is defined as the interface between the compound semiconductor layer ISM and the p-type compound semiconductor layer PSM.

In the present embodiment also, by not forming the low-concentration n-type region LDD in the p-type GaN layer where the impurity concentration is high, it is possible to maintain the high mobility of the low-concentration n-type region LDD. Because of this, the same effect as that of the First Embodiment is obtained. Furthermore, because the p-type compound semiconductor layer PSM is located in the lower layer of the low-concentration n-type region LDD, hole carriers are supplied from the p-type compound semiconductor layer PSM when the gate voltage is off. Because of this, by the RESURF (Reduced Surface Field) effect, the depletion layer extends and the breakdown voltage of the semiconductor device is increased compared to that of the First Embodiment.

Third Embodiment

Figure 11:
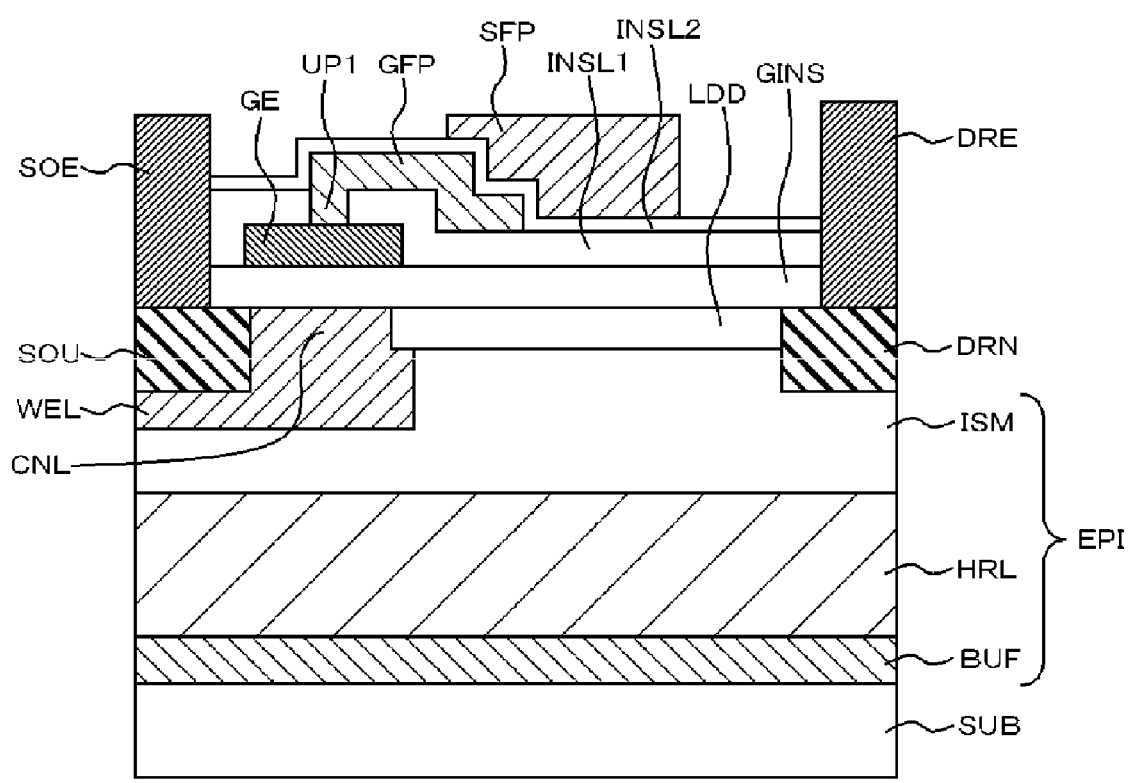
FIG. 11 is a cross-sectional view illustrating a structure of a semiconductor device of a Third Embodiment.

FIG. 11 is a cross-sectional view illustrating a structure of a semiconductor device of a Third Embodiment. The semiconductor device of the present embodiment is the same as that of the First Embodiment except in that a source field plate electrode SFP and a gate field plate electrode GFP are constituted in the upper layer of the low-concentration n-type region LDD. In the present embodiment, the semiconductor device may have only one of the source field plate electrode SFP and the gate field plate electrode GFP.

The source field plate electrode SFP is installed above the low-concentration n-type region LDD and with a sufficient space from the drain electrode DRE, in a plan view. Although not illustrated in particular, the source field plate electrode SFP is electrically coupled to the source electrode SOE. The wiring for coupling may stride over the gate electrode GE or may be formed in the same layer as that of the source field plate electrode SFP and the source electrode SOE in the form of a ladder. Similarly, the gate field plate electrode GFP is also installed above the low-concentration n-type region LDD and with a sufficient space from the source electrode SOE and the drain electrode DRE in a plan view.

In the example illustrated in FIG. 11, the gate field plate electrode GFP is formed over the wiring layer insulating film INSL1. In addition, a wiring layer insulating film INSL2 is formed over the wiring layer insulating film INSL1 and the source field plate electrode SFP is formed over the wiring layer insulating film INSL2. Furthermore, in a plan view, the source field plate electrode SFP is located close to the drain electrode DRE than the gate field plate electrode GFP. The wiring layer insulating film INSL2 is, for example, a SiO$_2$ film or a SiN film.

Figure 12:
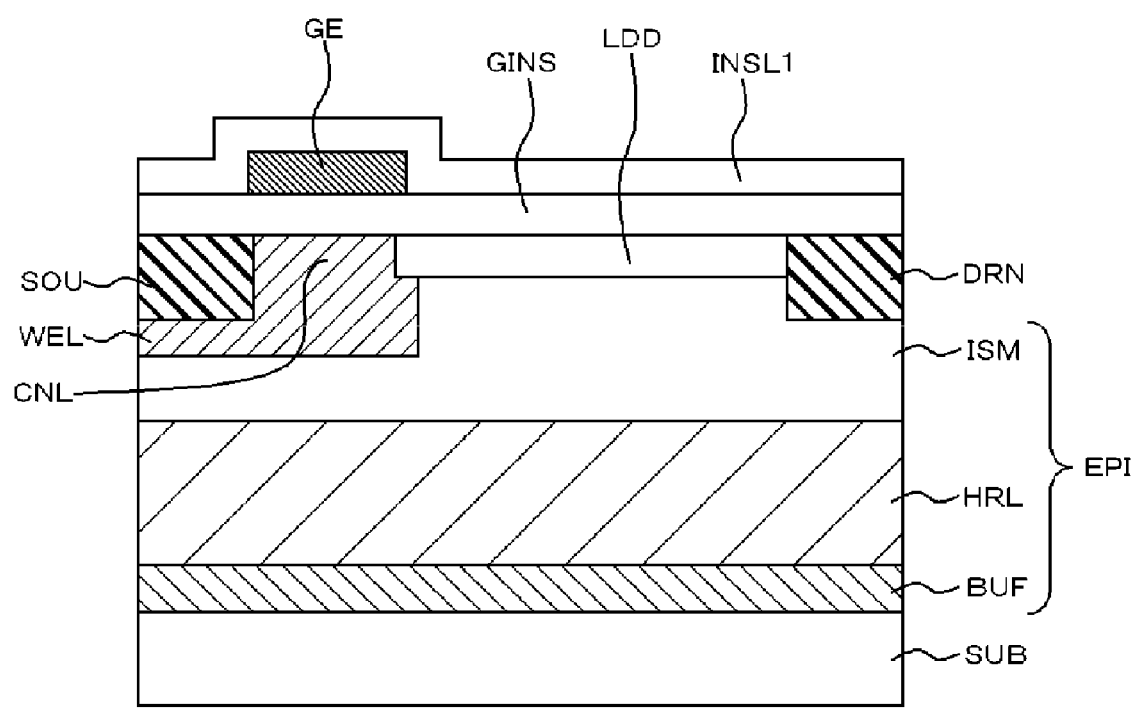
FIG. 12 is a diagram illustrating a manufacturing method of the semiconductor device of the Third Embodiment.
Figure 13:
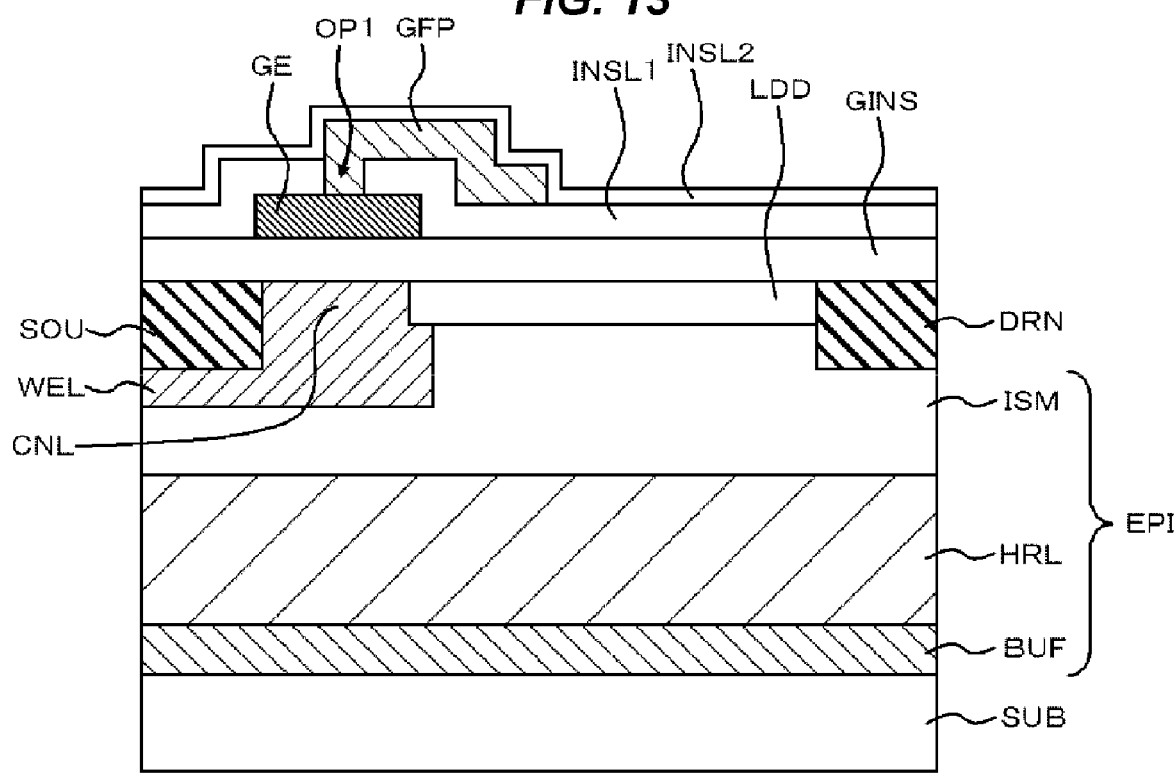
FIG. 13 is a diagram illustrating the manufacturing method of the semiconductor device of the Third Embodiment.
Figure 14:
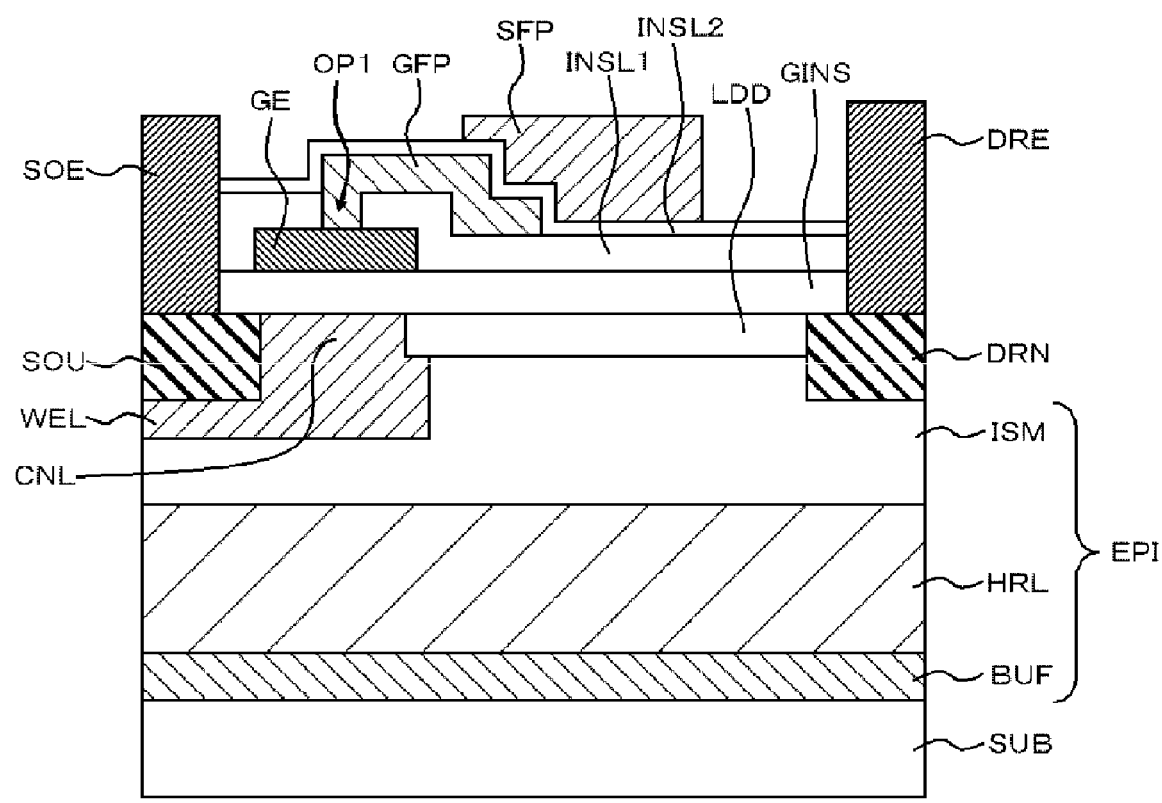
FIG. 14 is a diagram illustrating the manufacturing method of the semiconductor device of the Third Embodiment.

FIG. 12 to FIG. 14 are diagrams illustrating a manufacturing method of the semiconductor device of the Third Embodiment. First, in the same manner as that of the First Embodiment, a structure illustrated in FIG. 12 is fabricated (that is, fabrication of up to the wiring layer insulating film INSL1 is completed). Namely, after forming the gate electrode GE over the gate insulating film GINS, the wiring layer insulating film INSL1 is formed.

Next, as illustrated in FIG. 13, in the wiring layer insulating film INSL1, a coupling hole OP1 located over the gate electrode GE is opened. Next, an electrically conductive film is formed over the wiring layer insulating film INSL1 and within the coupling hole OP1, and the electrically conductive film is removed selectively. Due to this, the gate field plate electrode GFP is formed.

Next, over the gate field plate electrode GFP and over the wiring layer insulating film INSL1, the wiring layer insulating film INSL2 is formed. The insulating materials of the wiring layer insulating film INSL1 and the wiring layer insulating film INSL2 may be the same or different. For example, both the wiring layer insulating films INSL1 and INSL2 may be SiO$_2$ films or one of them may be a SiO$_2$ film and the other may be a SiN film.

Next, as illustrated in FIG. 14, by the same manufacturing method as that of the First Embodiment, the source electrode SOE and the drain electrode DRE are formed. At this time, the source field plate electrode SFP is formed at the same time as each electrode.

By the present embodiment also, the same effect as that of the First Embodiment is obtained. Furthermore, by providing at least one of the source field plate electrode SFP and the gate field plate electrode GFP, the depletion layer in the low-concentration n-type region LDD extends when the transistor is off. When the impurity concentration of the low-concentration n-type region LDD becomes a fixed level or more, the depletion layer no longer extends through the entire low-concentration n-type region LDD, and therefore, the breakdown voltage reduces, but by the installation of the field plate, it becomes possible to extend the depletion layer through the entire low-concentration n-type region LDD. Because of this, with maintenance of a high breakdown voltage, the increase in the concentration of the low-concentration n-type region LDD, namely, the reduction in resistance becomes possible.

Fourth Embodiment

Figure 15:
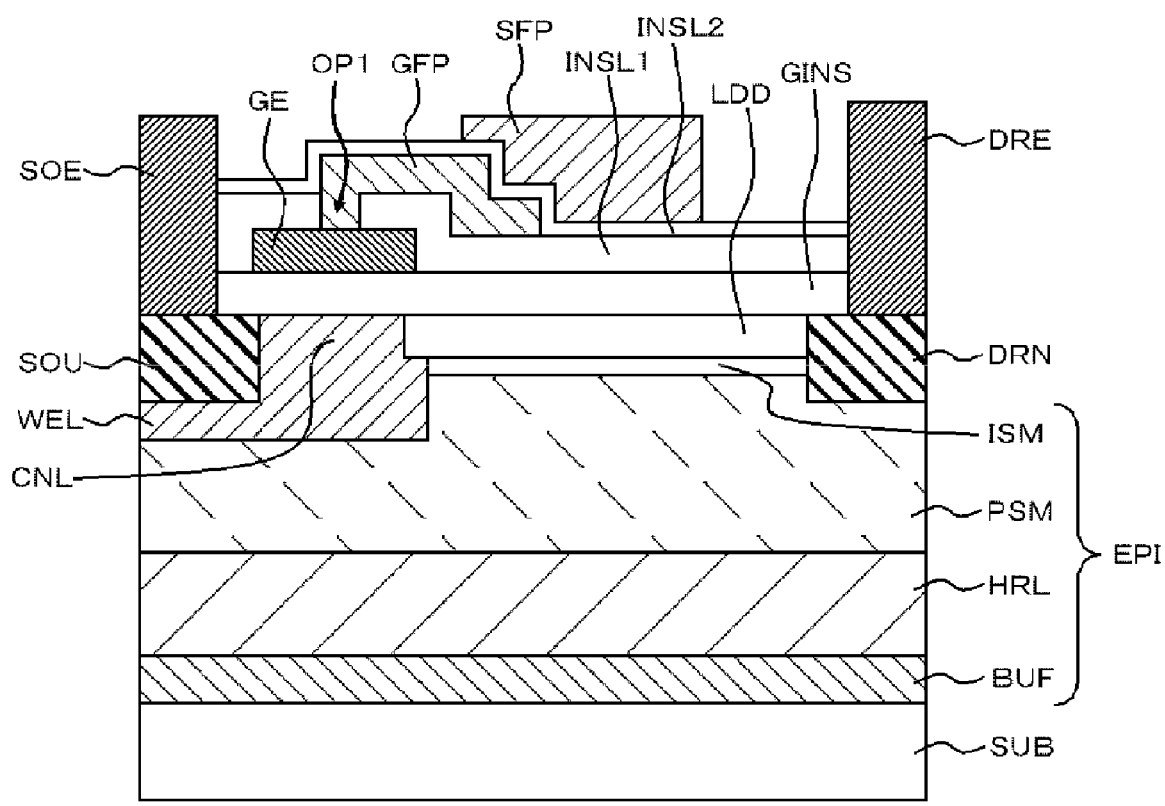
FIG. 15 is a cross-sectional view illustrating a structure of a semiconductor device of a Fourth Embodiment.

FIG. 15 is a cross-sectional view illustrating a structure of a semiconductor device of a Fourth Embodiment. The semiconductor device according to the present embodiment is the same as the semiconductor device according to the Third Embodiment except in that the compound semiconductor layer EPI has the p-type compound semiconductor layer PSM illustrated in the Second Embodiment.

According to the present embodiment, both the effect shown in the Second Embodiment and the effect shown in the Third Embodiment can be obtained.

Fifth Embodiment

Figure 16:
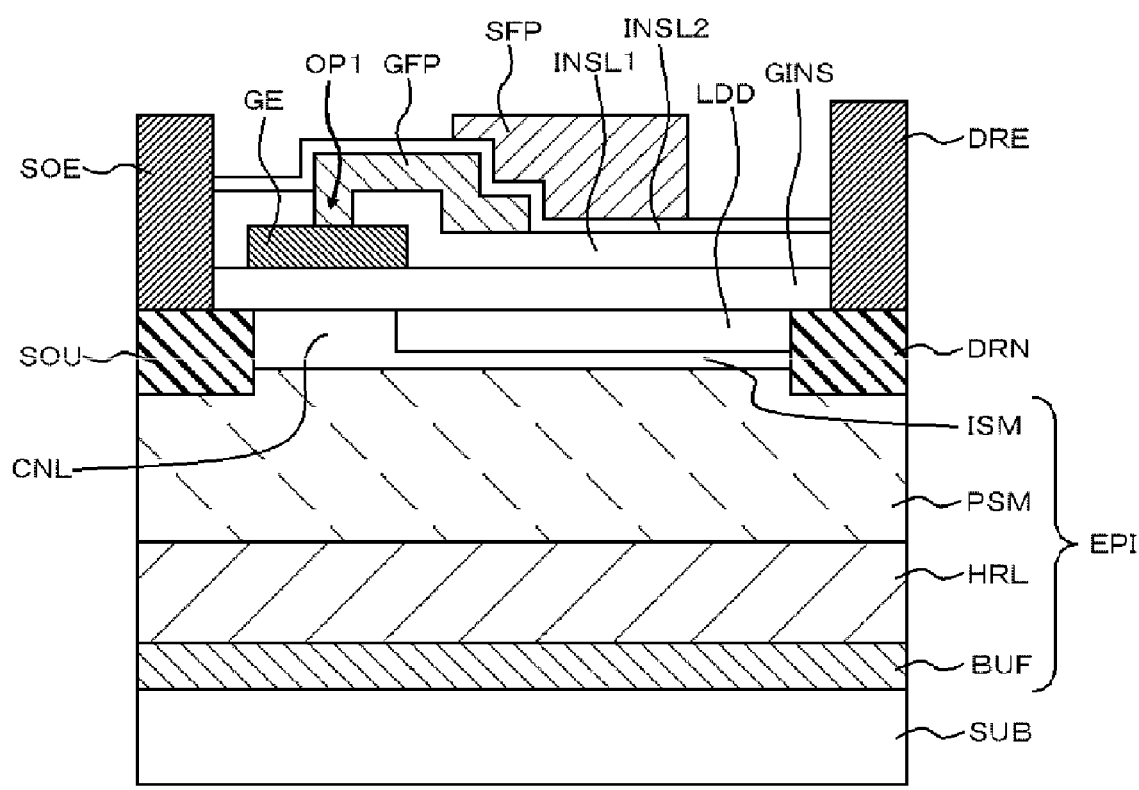
FIG. 16 is a cross-sectional view illustrating a structure of a semiconductor device of a Fifth Embodiment.

FIG. 16 is a cross-sectional view illustrating a structure of a semiconductor device of a Fifth Embodiment. The semiconductor device according to the present embodiment is the same as the semiconductor device according to the Fourth Embodiment except having no well WEL.

According to the present embodiment, the hole carriers formed in the p-type compound semiconductor layer PSM can move into the compound semiconductor layer ISM. Because of this, it is possible to realize the normally-off type transistor without forming the well WEL. Consequently, the same effect as that of the Fourth Embodiment is obtained. Furthermore, when the impurity concentration of the channel part is lowered, the channel resistance is also reduced, and thus it becomes possible to realize a semiconductor device having a lower resistance.

Figure 17:
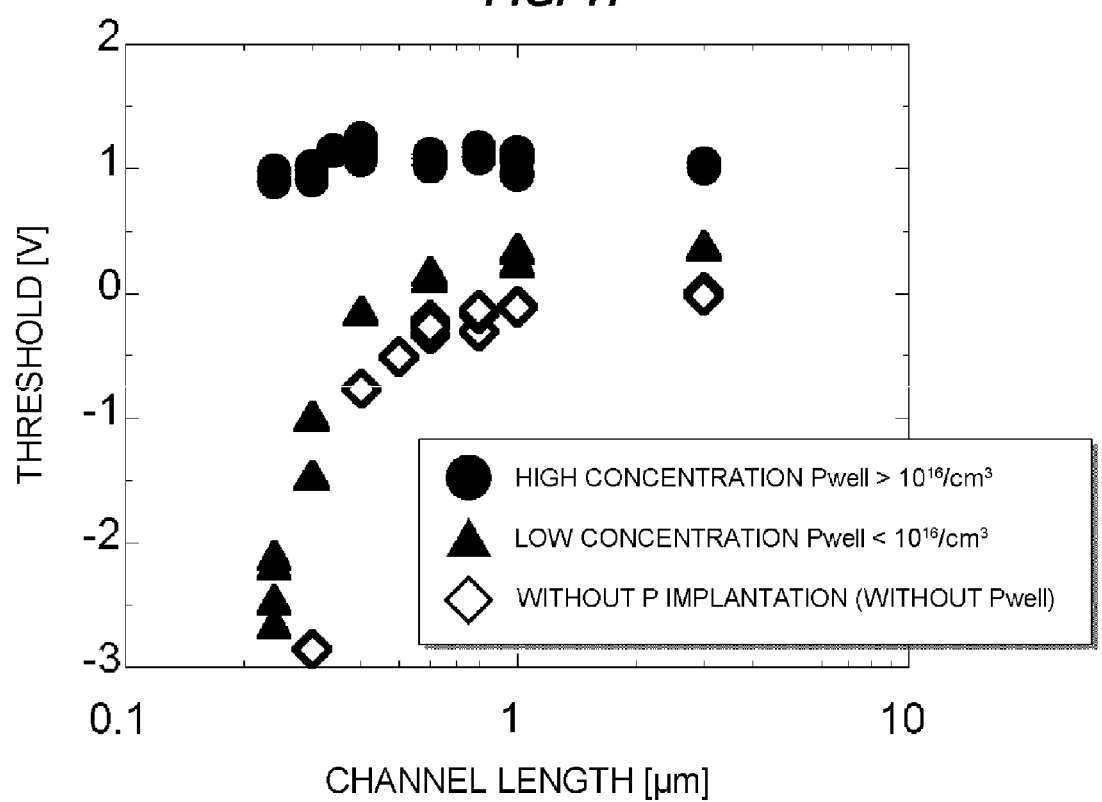
FIG. 17 is a graph for explaining a relationship between the channel length and the threshold.

Next, the effect of the semiconductor device of each embodiment described above will be explained in comparison with a comparative example. FIG. 17 is a graph for explaining a relationship between the channel length and the threshold in the semiconductor device according to the First Embodiment. It is known that the threshold of the transistor does not depend on the channel length and indicates a positive fixed value in the case where the impurity concentration of the well WEL is $1\times10^{16}$ cm$^{-3}$ or more. From this, it is known that the normally-off transistor can be formed by forming the well WEL.

Figure 18:
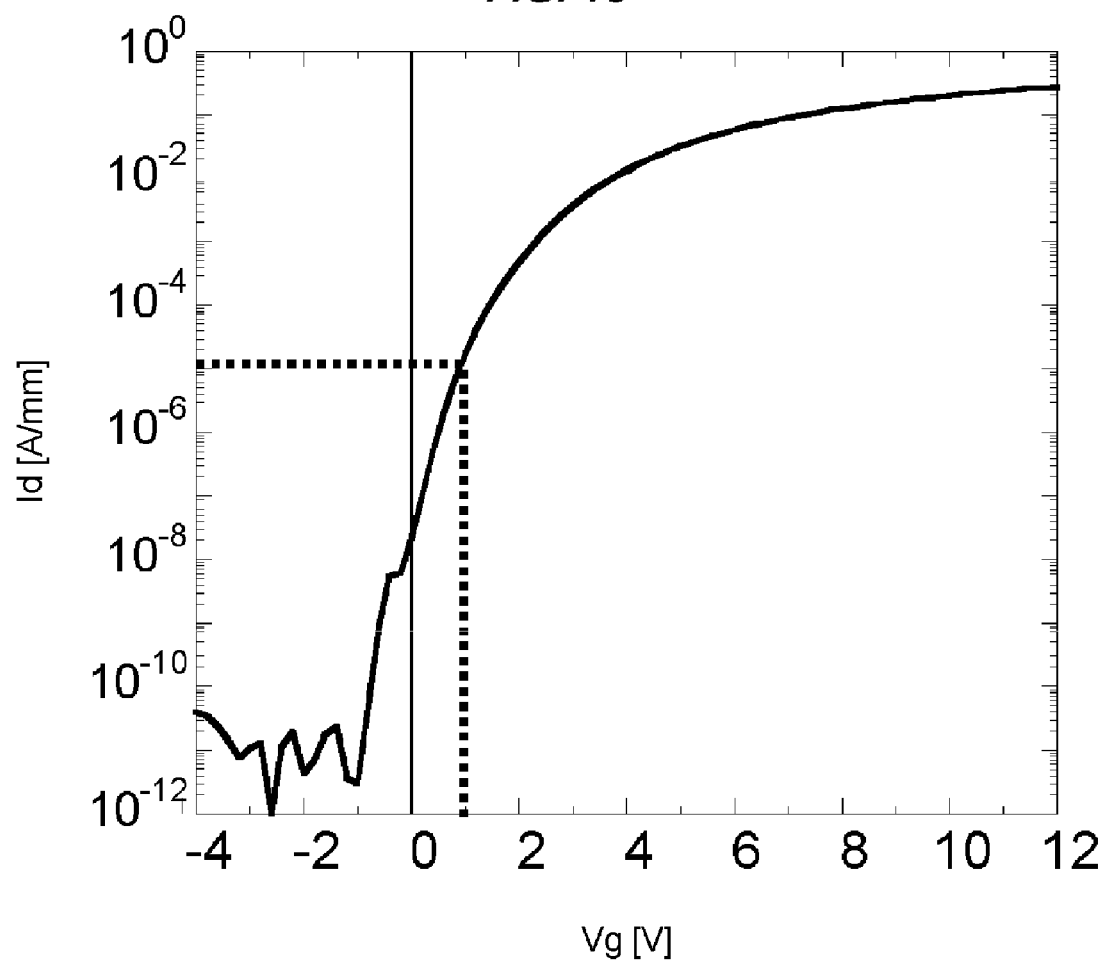
FIG. 18 is a graph for explaining a relationship of the on-current per unit gate length.

FIG. 18 is a graph for explaining a relationship of the on-current per unit gate length at each gate voltage in the semiconductor device according to the First Embodiment. It is known that the on-threshold is about 1 V in the case where 10 uA/mm is set to be the boundary between on and off.

Figure 19:
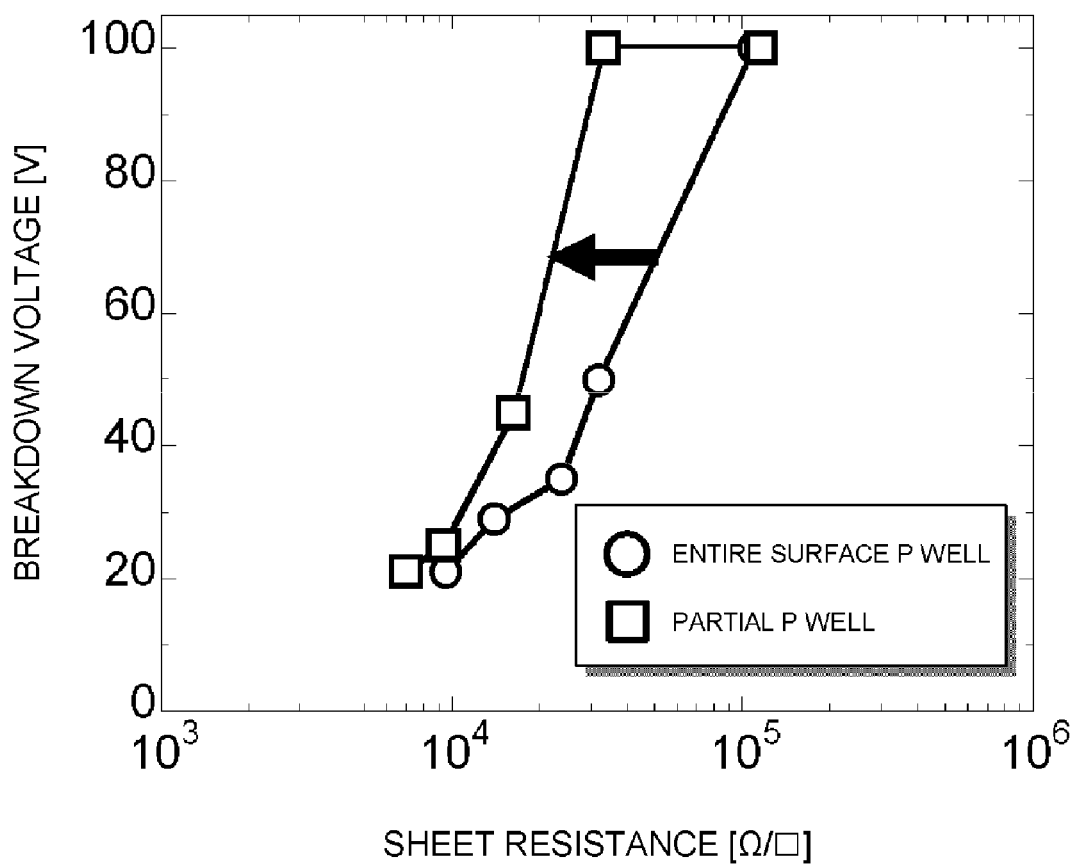
FIG. 19 is a graph for explaining a relationship between the sheet resistance and the breakdown voltage of a low-concentration n-type region LDD.

FIG. 19 is a graph for explaining a relationship between the sheet resistance and the breakdown voltage of the low-concentration n-type region LDD having the same impurity concentration. The case where the well WEL is formed on the entire surface of the region serving as the transistor (that is, the case where the low-concentration n-type region LDD is formed within the well WEL) and the case where the well WEL is formed only in the region serving as the channel region CNL and the source region SOU are compared. It is indicated that the presence of the well WEL increases the resistance of the low-concentration n-type region LDD in the case where the breakdown voltage is maintained. Conversely, FIG. 19 indicates that if there is no P well overlapping with the LDD layer, it is possible to realize the low-concentration n-type region LDD as an LDD having a low resistance.

Figure 20:
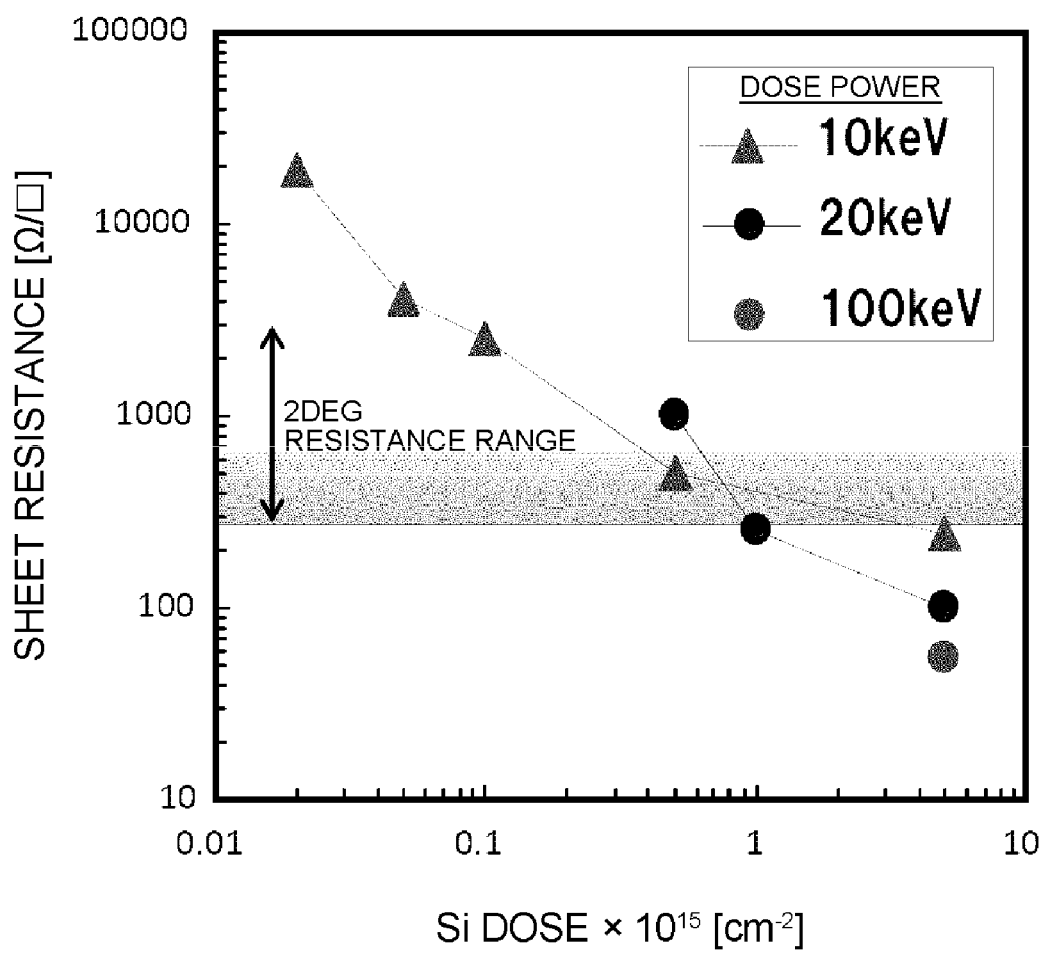
FIG. 20 is a graph for explaining a relationship between the sheet resistance and the amount of implanted Si of an n-type GaN layer.

FIG. 20 is a graph for explaining a relationship between the sheet resistance of an n-type GaN layer and the amount of implanted Si. In the range of application to the source region SOU, it is possible to realize a sheet resistance lower than that in the case where the 2DEG (two-dimensional electron gas) is utilized. This indicates that the contact resistance between the source region SOU and the source electrode SOE and the contact resistance between the drain region DRN and the drain electrode DRE become lower than those in the case where impurity implantation is not used.

Figure 21:
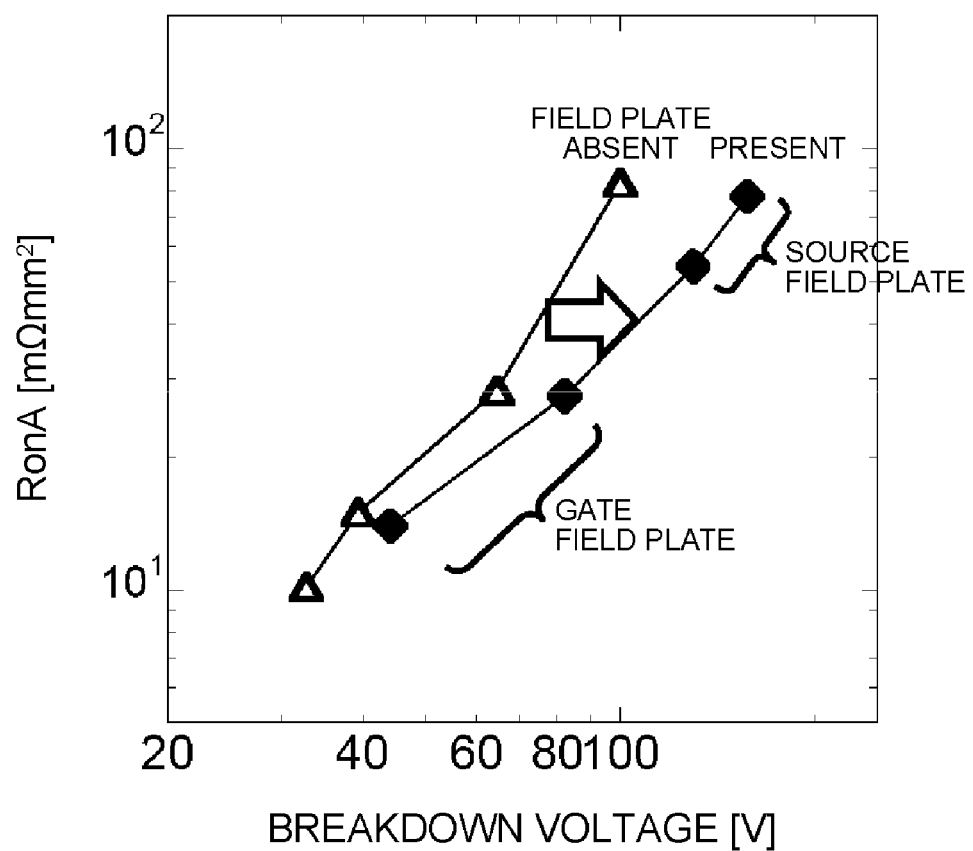
FIG. 21 is a graph for explaining changes in the breakdown voltage depending on the presence or absence of a field plate.

FIG. 21 is a graph for explaining a change in breakdown voltage depending on the presence or absence of a field plate (for example, the gate field plate electrode GFP or the source field plate electrode SFP). In the case where a field plate is present, the breakdown voltage is enhanced by a factor of about 2 while maintaining the same area resistivity (RonA). This indicates that it is possible to enhance the breakdown voltage by a field plate due to the effect of extended depletion layer.

Figure 22:
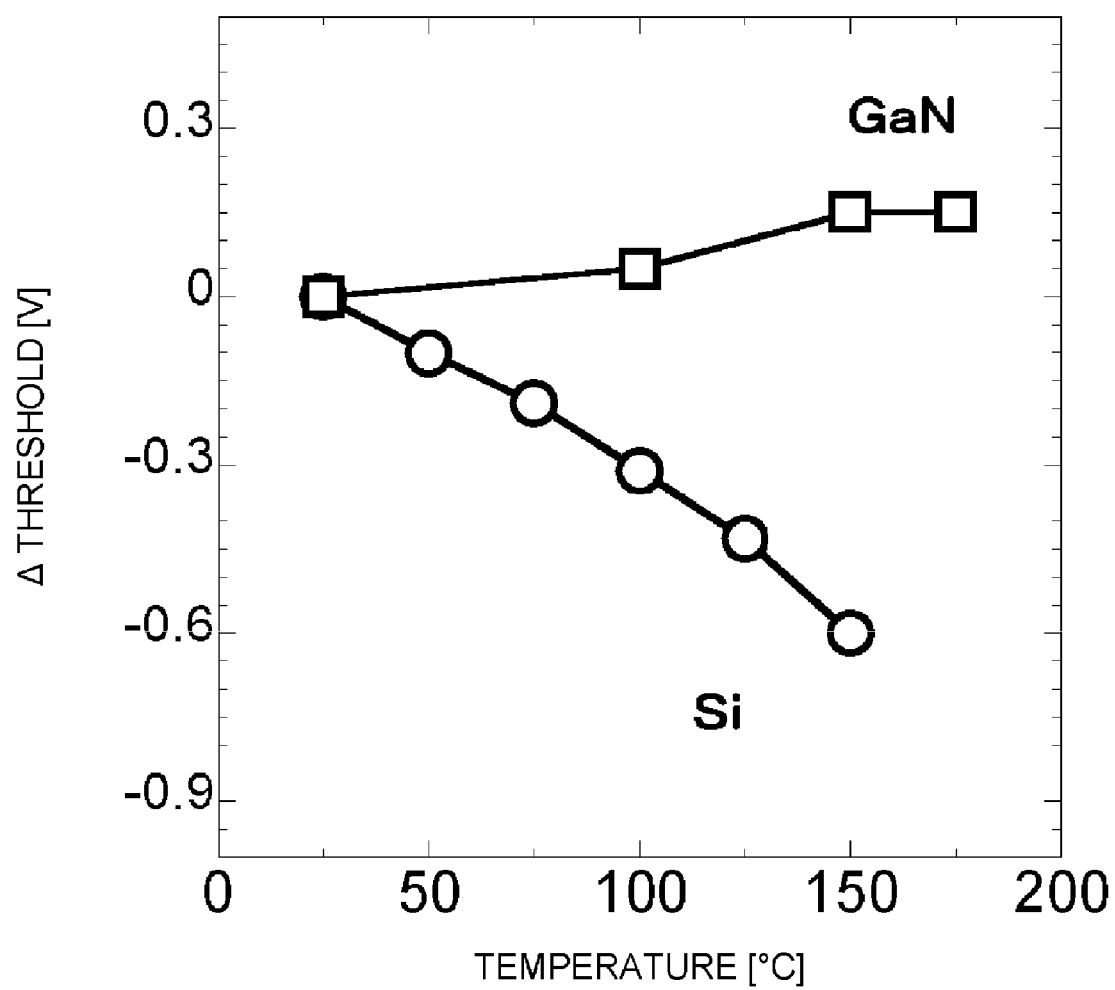
FIG. 22 is a graph for explaining a relationship between the operating temperature and the amount of change in threshold.

FIG. 22 is a graph for explaining a relationship between the operating temperature and the amount of change in threshold. It is indicated that in the Si-MOS, the higher the operating temperature becomes, the lower the threshold becomes, but in the LDD-MISFET of GaN, the temperature dependence is low.

Figure 23:
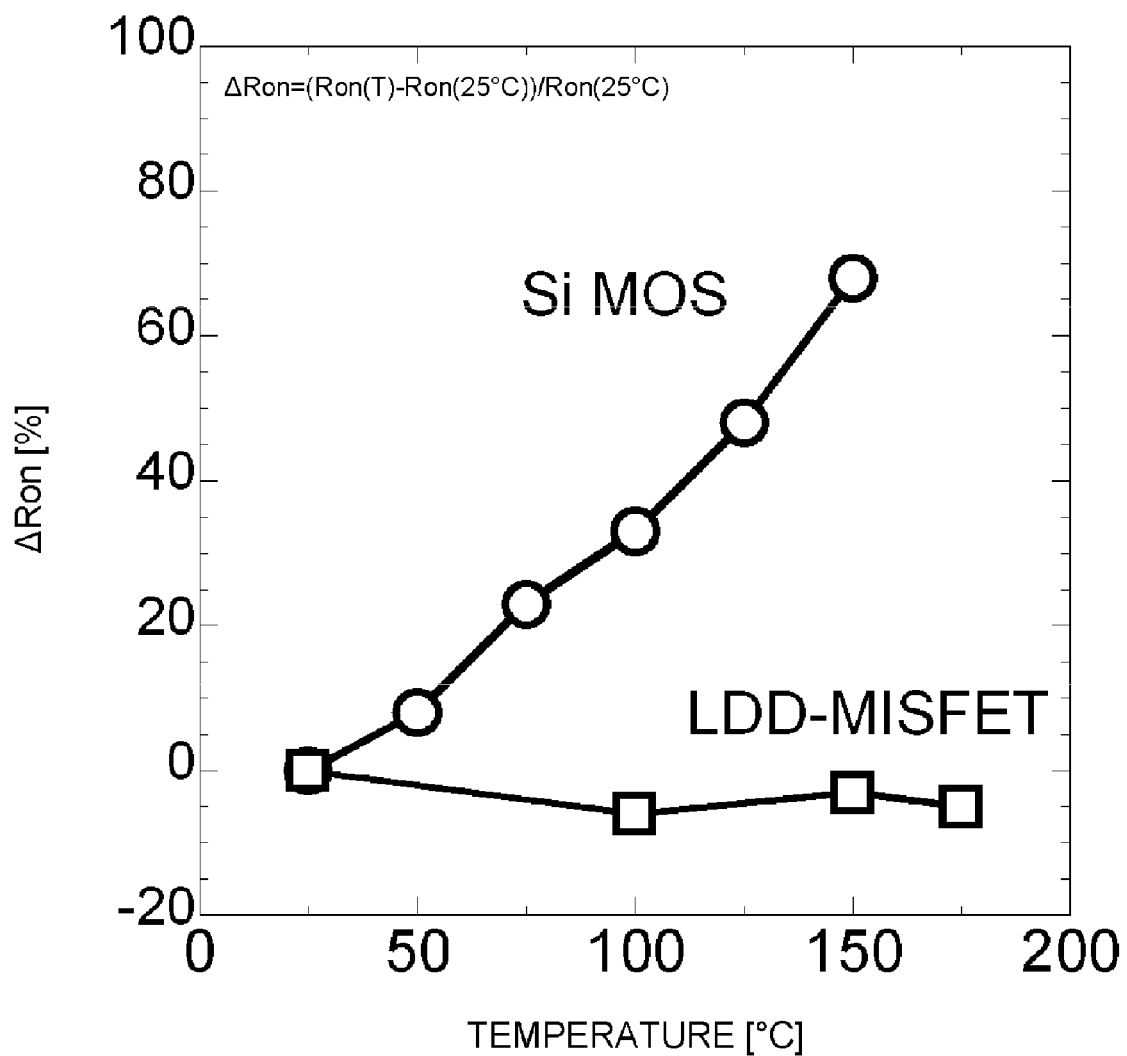
FIG. 23 is a graph for explaining a relationship between the operating temperature and the device resistance.

FIG. 23 is a graph for explaining a relationship between the operating temperature and the device resistance. It is indicated that while the Si-MOS depends on the operating temperature and the resistance of the device increases, the resistance of the device is constant in the LDD-MISFET of GaN. From FIG. 22 and FIG. 23, it is indicated that the LDD-MISFET of GaN is superior to the Si-MOS in terms of the high-temperature operation.

Figure 24:
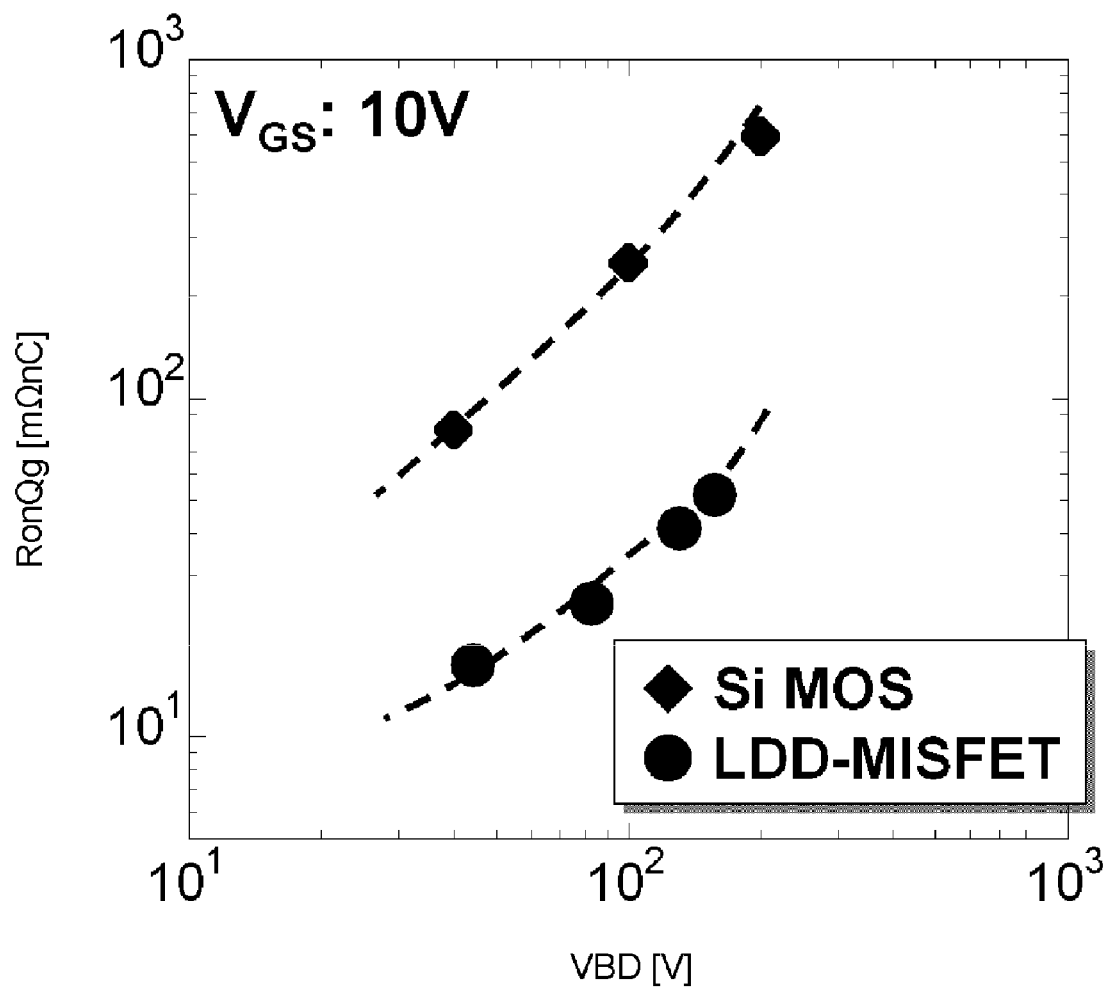
FIG. 24 is a graph for explaining a relationship between a breakdown voltage VBD and the gate capacitance per resistance.

FIG. 24 is a graph for explaining a relationship between the breakdown voltage VBD and the gate capacitance per resistance. By comparison with a general Si-MOS for high frequencies, it is known that the performance of the LDD-MISFET of GaN is superior (lower capacitance) by about one digit.

Figure 25A:
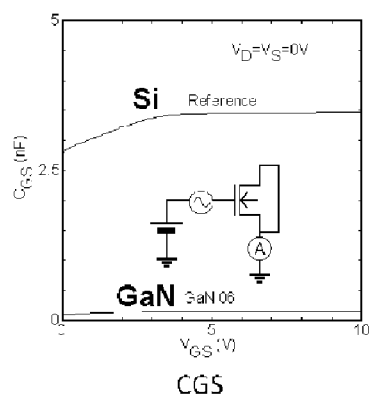
FIGS. 25A to 25C illustrate comparisons of the gate capacitance between Si-MOS and GaN LDD-MISFET, both having a chip resistance of 0.1 Ω.
Figure 25B:
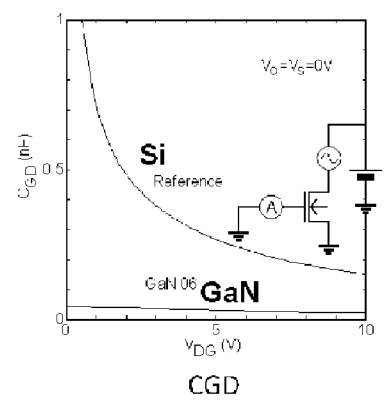
Figure 25C:
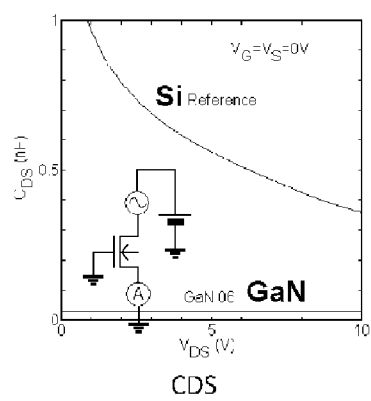

FIGS. 25A to 25C illustrate comparisons between gate capacitances of the Si-MOS and the LDD-MISFET of GaN, both having a chip resistance of 0.1Ω. The capacitance between gate and source (GS), the capacitance between gate and drain (GD), and the capacitance between drain and source (DS) are measured, respectively. It is known that all the capacitances of the LDD-MISFET are one-tenth or less of the capacitances of the Si-MOS.

Figure 26:
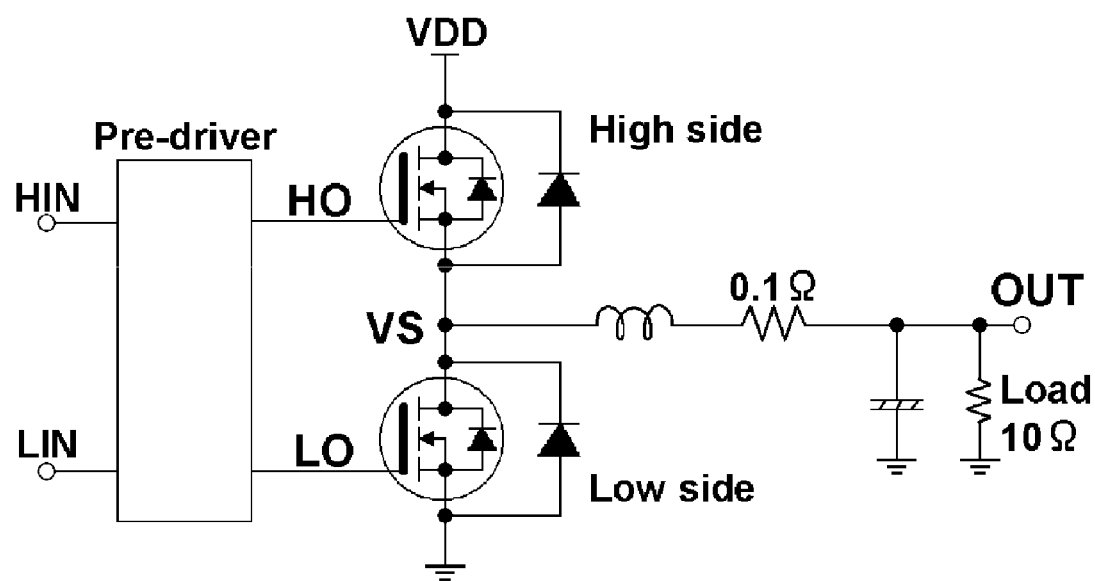
FIG. 26 illustrates circuit diagrams for evaluating the high-frequency operations of Si-MOS and GaN LDD-MISFET both having a chip resistance of 0.1 Ω.

FIG. 26 illustrates circuit diagrams for evaluating the high-frequency operations of the Si-MOS and the LDD-MISFET of GaN, both having a chip resistance of 0.1Ω. The transistors corresponding to HO and LO portions are replaced with the Si-MOS and the LDD-MISFET of GaN and then performance is evaluated. FIG. 27 is a diagram for explaining respective output waveforms when the Si-MOS and the LDD-MISFET are operated respectively in the circuits in FIG. 26. In the evaluation of the operation at an operating frequency of 300 kHz, as seen remarkably in the waveform of the LO, the rise at power ON of the Si-MOS becomes dull. From the comparison of output waveforms, it is known that the loss of the LDD-MISFET of GaN is low for the high-frequency operation.

Figure 28A:
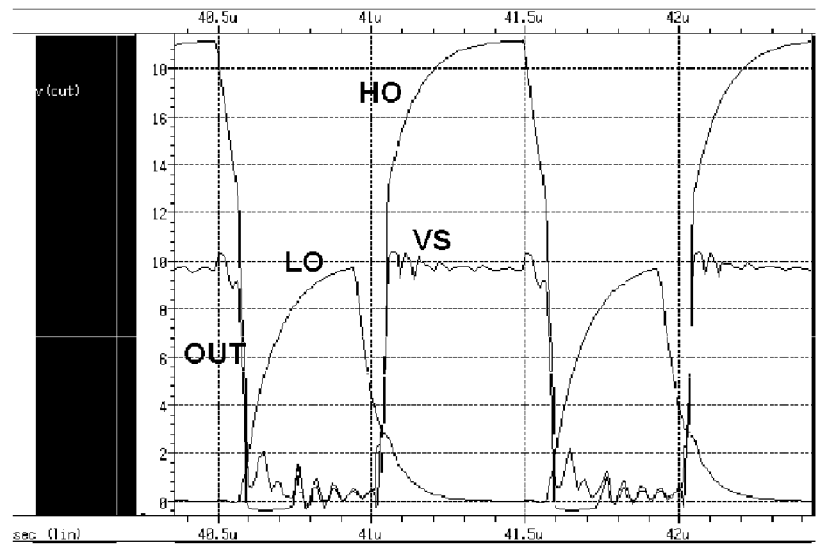
FIGS. 28A and 28B are graphs illustrating simulation results of the high-frequency operations of Si-MOS and LDD-MISFET.
Figure 28B:
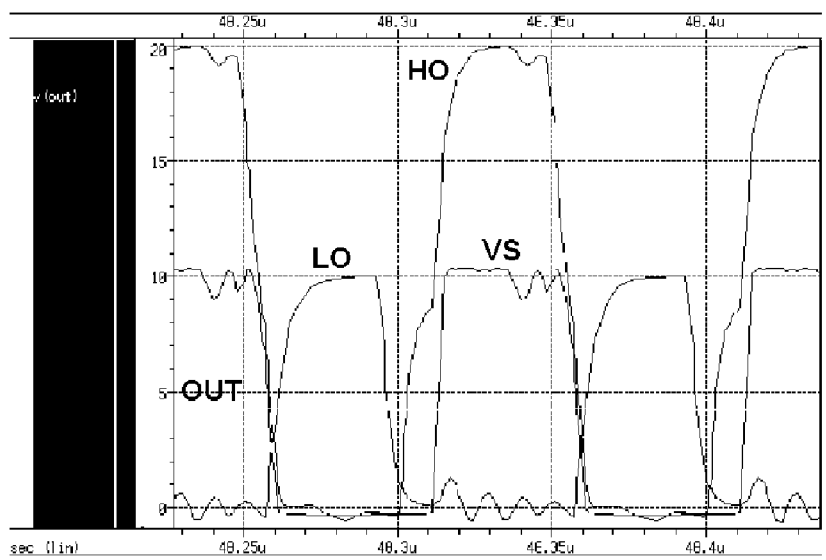
Figure 29:
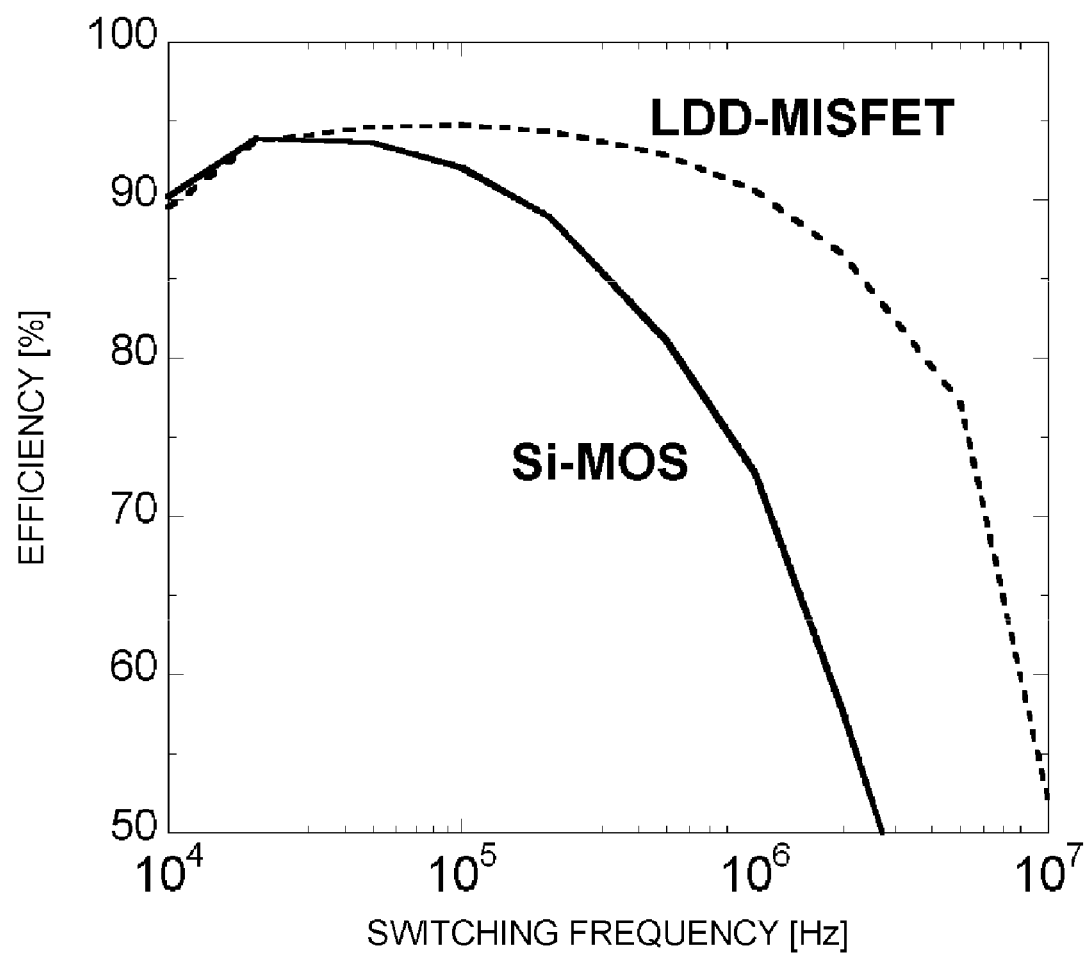
FIG. 29 is a graph for explaining a relationship between the operating frequency and the efficiency of each of Si-MOS and GaN LDD-MISFET.

Furthermore, it is possible to use the circuits illustrated in FIG. 26 also in the SPICE simulation. It is possible to evaluate the high-frequency operation by inputting the device parameters of the Si-MOS and the LDD-MISFET of GaN used for the performance evaluation explained in FIG. 27 to the HO and the LO. FIGS. 28A and 28B are graphs for explaining examples of the calculation results. It is indicated that while in the operation at 1 MHz of the Si-MOS, switching becomes difficult, the LDD-MISFET of GaN is sufficiently operable even at 10 MHz. FIG. 29 is a graph for explaining a relationship between the operating frequency of each of the Si-MOS and the LDD-MISFET of GaN and the efficiency. The comparison between the Si-MOS and the LDD-MISFET of GaN indicates that the LDD-MISFET of GaN is much superior to the conventional device in the high frequency region.

As above, although specific explanation is given on the basis of the embodiments of the invention made by the inventors of the present invention, it is needless to say that the present invention is not limited to the above-described embodiments and there can be various modifications within the scope not deviating from its gist.

What is claimed is:
1. A semiconductor device comprising:
a substrate;
a compound semiconductor layer that is formed over the substrate, that has both the concentration of p-type impurities and the concentration of n-type impurities being less than $1\times10^{16}/\text{cm}^3$, and that includes a group III nitride compound;

a p-type well that is formed in the compound semiconductor layer;

a source region that is formed in the compound semiconductor layer and that is an n-type impurity layer;

a low-concentration n-type region that is formed in the compound semiconductor layer and that is linked to the well;

a drain region that is formed in the compound semiconductor layer, that is located on a side opposite to the well via the low-concentration n-type region, and that is an n-type impurity layer;

a gate insulating film that is formed over a portion of the well located between the source region and the low-concentration n-type region; and a gate electrode that is formed over the gate insulating film.

2. The semiconductor device according to claim 1, wherein the source region is formed within the well.

3. The semiconductor device according to claim 1, comprising a high-resistance compound semiconductor layer that is located between the substrate and the compound semiconductor layer and that has a sheet resistance higher than that of the compound semiconductor layer.

4. The semiconductor device according to claim 3, comprising a buffer layer located between the high-resistance compound semiconductor layer and the substrate.

5. The semiconductor device according to claim 1, comprising a p-type compound semiconductor layer that is formed under the compound semiconductor layer and that has an impurity concentration higher than that of the well, wherein a lower part of the well and a lower part of the drain region are located within the p-type compound semiconductor layer.

6. The semiconductor device according to claim 1, wherein the impurity concentration of the well is $1\times10^{16}$ $\text{cm}^{-3}$ or more and $1\times10^{19}$ $\text{cm}^{-3}$ or less.

7. The semiconductor device according to claim 1, comprising:

an insulating layer formed over the low-concentration n-type region; and a field plate electrode formed over the insulating layer.

8. The semiconductor device according to claim 1, wherein the compound semiconductor layer is a nitride gallium layer.

9. The semiconductor device according to claim 1, wherein the impurity concentration of the low-concentration n-type region is $1\times10^{16}$ $\text{cm}^{-3}$ or more and $1\times10^{19}$ $\text{cm}^{-3}$ or less, and wherein the impurity concentration of the drain region is $1\times10^{19}$ $\text{cm}^{-3}$ or more and $1\times10^{22}$ $\text{cm}^{-3}$ or less.

* * * * *